US006359460B1

(12) United States Patent
Tanaka

(10) Patent No.: US 6,359,460 B1
(45) Date of Patent: Mar. 19, 2002

(54) SEMICONDUCTOR MEMORY DEVICE

(75) Inventor: Akio Tanaka, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/413,589

(22) Filed: Oct. 6, 1999

(30) Foreign Application Priority Data

Oct. 6, 1998 (JP) .......................................... 10-284464

(51) Int. Cl.[7] .............................................. G01R 31/26
(52) U.S. Cl. .................................... 324/765; 763/158.1
(58) Field of Search ............................. 324/765, 158.1, 324/73.1, 750, 752, 763; 250/467, 414, 415; 348/164, 247; 714/733, 734

(56) References Cited

U.S. PATENT DOCUMENTS 5,861,913 A * 1/1999 Tanaka ........................ 348/164

* cited by examiner

*Primary Examiner*—Vinh P. Nguyen
(74) *Attorney, Agent, or Firm*—Young & Thompson

(57) ABSTRACT

A semiconductor device having a large bias component detects a faint signal component on the bias component, includes a first bias circuit with a reference resistance connected to a measuring resistance group and having the same resistance temperature coefficient as the measuring resistance, a second bias circuit provided with a reference resistance being connected to a cancel resistance and having the same resistance temperature coefficient as the cancel resistance, and a third bias circuit provided with a reference resistance being connected to a correction resistance and having the same resistance temperature coefficient as the correction resistance. The first bias circuit is for applying the output voltage to the measuring resistance group; the second bias circuit is for applying the output voltage to the cancel resistance; and the third bias circuit is for applying the output voltage to the correction resistance.

11 Claims, 14 Drawing Sheets band-gap reference circuit (BGR)

fourth embodiment (detail in FIG. 11)

SEMICONDUCTOR MEMORY DEVICE

BACKGROUND OF THE INVENTION

The present invention relates to a semiconductor device, and more particularly to a semiconductor device provided with an integration circuit comprising a resistance and a capacitor accumulating currents flowing through them for detecting variation in resistance value of the resistances in order to detect variation in various physical value (such as infrared ray, microwave/milliwave, temperature, magnetic, and pressure) such as an infrared ray sensor, a microwave/milliwave detector, a temperature sensor, a magnetic sensor, a pressure sensor, a gas sensor and a flow sensor.

The description will hereinafter be made by an example of focusing a thermal infrared ray image pick-up device. Notwithstanding this example, the present invention is applicable to all semiconductor devices that integrate faint signal components for detection.

DESCRIPTION OF THE RELATED ART

A conventional thermal infrared ray image pick-up device is mentioned in Japanese laid-open patent publication No. 9-315455.

FIG. 14 is a cross sectional view illustrative of the conventional thermal infrared ray image pick-up device mentioned in Japanese laid-open patent publication No. 9-315455.

As illustrated in this drawing, a semiconductor substrate 1401 is formed with a scanning circuit 1402 over which a plurality of photo-receiving regions 1400 for converting an incident infrared ray into electric signals.

One of the photo-receiving regions 1400 comprises a single pixel of the image pick-up device. In order to obtain a two-dimensional infrared ray image, a two-dimensional integration of plural pixels. Under the photo-receiving regions 1400, there is a two-dimensional integration of scanning circuits 1402 for reading out image data picked up.

The photo-receiving region 1400 has a film-structure so called as a diaphragm. In a diaphragm 1403 in the drawing, a cavity 1404 is formed at its bottom portion. This cavity 1404 is formed by removing a previously formed dummy layer, via an etching process.

On a surface of the diaphragm 1403, an infrared ray absorption layer 1405 is formed for absorbing the infrared ray. At a boundary between the diaphragm 1403 and the cavity 1404, a thermoelectric converter 1406 is formed for converting a heat generated due to receipt of the infrared ray into an electric signal. As this thermoelectric converter 1406, a bolometer is used in this example that varies in electric resistance depending upon temperature. Titanium is, for example, used for the bolometer.

Meanwhile, operations of the thermal infrared ray image pick-up device of FIG. 14 will briefly be described as follows.

An incident infrared ray into the photo-receiving region 1400 in each pixel is absorbed into the infrared ray absorption layer 1405 to cause an increase in temperature of the diaphragm 1403 in each pixel, whereby this temperature increase is converted by the thermoelectric converter 1406 (bolometer) into electric signals which are then read-out sequentially via the scanning circuit.

The thermal infrared ray image pick-up device of FIG. 14 will be described in detail.

FIG. 15 shows a read-out circuit used in the thermal infrared ray image pick-up device of FIG. 14.

As shown in the drawing, a read-out circuit 1500 is provided with a plurality of bolometer 1501, pixel switches 1509 connected between the bolometers 1501 and a ground, an NPN transistor 1502, a cancel resistance 1503, a PNP transistor 1504, an integration capacitor 1505, a sample hold circuit 1506, an FPN correction constant current source 1507, and a reset switch 1508 opening/closing upon an input of a reset signal ΦR.

The sample hold circuit 1506 comprises NMOS transistors 1510 and 1511 on a former stage, a switch 1512 opening/closing in accordance with an externally inputted sample hold pulse ΦS/H, a hold capacitor 1513 and NMOS transistors 1514 and 1515 on a later stage.

As described in FIG. 14, the bolometer 1501 senses a heat generation due to an incident infrared ray for conversion into electric signals. For example, if a voltage Vb1 is applied to a base of the NPN transistor 1502, the bolometer 1501 is applied with a voltage Vb1−VBE where VBE is a base-emitter voltage. A collector of the NPN transistor 1502 is applied with a current Ic1=(Vb1−VBE)/Rb1 where Rb1 is a resistance of the bolometer.

If a voltage Vb2 is applied to a base of the PNP transistor 1504, a collector of the NPN transistor 1504 is applied with a current Ic2=(Vb2−VBE)/Rb2 where Rb2 is a resistance of the cancel resistance.

Ic1 and Ic2 are almost balanced with each other but are slightly different from each other, for which reason the integration capacitor 1505 is applied with a slight difference ΔI=Ic1−Ic2. Namely, this difference ΔI is a sum of a signal component and a remaining bias component, wherein a majority of the bias component has been removed.

The externally incident infrared ray causes a temperature increase of the diaphragm 1403 thermally isolated (FIG. 14) to cause variation in resistance value of the bolometer 1501. This variation in resistance value causes a variation of Ic1, whereby the difference ΔI is accumulated in the integration capacitor 1505.

The bias component, which could not be removed, is caused by variation of the plural bolometers 1501 sequentially selected in the most case. Since the single cancel resistance 1503 is used, Rb2 is fixed. Since, however, the plural bolometers 1501 are used, if there is a large variation in Rb2 of majority of them, there is also variation in the difference ΔI.

In order to correct the variation, in prior art, the FPN correction constant current source 1507 is further provided.

This FPN correction constant current circuit 1507 comprises plural-staged constant current sources not illustrated. Each of the constant current sources has a current value which is weighted with an integer power of 2, such as I0, 2·I0, 4·I0, . . . In accordance with variation of Rb1, a desirable one is selected form the constant current sources in order to reduce variation in the difference ΔI due to the variation of Rb1.

The corrected signal is accumulated in the integration capacitor 1505 and then converted from a high impedance to a low impedance by a source-follower in the sample hold circuit 1506. Time-sequentially sampled signals are temporary held in the hold capacitor 1513 and then outputted as outputs S/Hout. This output S/Hout is read out by the scanning circuit 1402, shown in FIG. 14.

The conventional thermal infrared ray image pick-up device has an issue of how to improve the temperature characteristics of the integration circuit comprising the integration capacitor 1505. The following has already been proposed as a circuit for improving the temperature characteristic of the integration circuit.

As shown in Japanese laid-open patent publication No. 2-260914, an integration circuit comprising a capacitor and a diffusion resistance is added with another diffusion resistance for compensation to a temperature dependency of a leakage of current through the diffusion resistance, so that the leakage of current is accumulated to the capacitor.

In Japanese laid-open patent publication No. 3-103711, it is mentioned that in order to prevent variation in output voltage from a magnetic sensor over temperature, the constant current source varies a current value depending upon temperature.

In Japanese laid-open patent publication No. 8-320266, it is mentioned that a constant current source having a constant current characteristic with a zero temperature coefficient is used to fix a current flowing through a piezo-resistance independently from temperature.

In Japanese laid-open patent publication No. 8-334413, it is mentioned that further to bolometers of the individual pixels, a temperature compensation resistance is provided which has the same material and structure as the bolometer so as to offset variation of the output offset voltage over temperature.

Those conventional ones have the following problems.

The first problem is that the thermal infrared ray sensor mentioned in Japanese laid-open patent publication No. 9-315455 shows variations among pixels depending upon variation in temperature of the device.

Namely, even if the FPN correction constant current source is used to correct the variations among the pixels at a temperature, any temperature variation makes it necessary to do the correction again. This is caused by variation in resistance value of the bolometer. A varying amount of the current due to the temperature variation depends upon the pixels.

Even if a Peltier device is added to the structure of Japanese laid-open patent publication No. 9-315455 so as to keep the temperature of the device constant. Actually, however, a highly accurate temperature control is needed, and the realization is difficult.

The example of Japanese laid-open patent publication No. 2-260914 is to correct the leakage of current of the resistance, but is not to correct the variation in the resistance value over temperature. This is not solution in case that variation amount of current over temperature is different among pixels.

The examples of Japanese laid-open patent publications Nos. 3-103711, 8-320266, and 8-334413 are not to integrate signals for reading out. These are not solution in case that variation amount of current over temperature is different among pixels.

The second problem is that in the thermal infrared ray image pick-up device mentioned in Japanese laid-open patent publication No. 9-315455, a voltage application to the bolometer cases the bolometer itself to generate a heat which bends an integration waveform, whereby it is impossible to increase a gain of the integration circuit. Namely, even canceling operation of Ic1–Ic2 and the FPN correction circuit reduce an amplitude of the integration waveform, a dynamic range of the circuit is occupied with the bent integration waveform. Of course, if the above and other prior arts are used, it is difficult to solve this point.

The third problem is that in the thermal infrared ray image pick-up device mentioned in Japanese laid-open patent publication No. 9-315455, a delicate setting to the bias voltages such as Vb1, Vb2 is necessary for deciding cancel operation of the bias current, and an adjustment to individual image pick-up devices is complicated. Namely, if setting the cancel operation of Ic1–Ic2 and setting the FPN correction circuit are not proper, the amplitude of the integration waveform goes out the dynamic range of the circuit. Of course, if the above and other prior arts are used, it is difficult to solve this point.

SUMMARY OF THE INVENTION

As described above, the present invention is to solve those issues and to provide a semiconductor device having a large bias component which has a large variation and detects a faint signal component on the bias component, wherein the semiconductor device is capable of stable correction to the bias component and its variation with a low noise for smooth signal amplification and signal processing.

In order to achieve the objects, a semiconductor device is provided with a read-out circuit which comprises: a measuring resistance group which comprises at least one measuring resistance for converting a physical value to a resistance value; a switching means being connected to the each measuring resistance for allowing a desired measuring resistance to be conductive; an integration circuit being connected to the measuring resistance group for applying a bias current to the measuring resistance group and integrally accumulating a current which flows through the measuring resistance group; a cancel resistance being connected to the measuring resistance group for canceling the bias current which flows through the measuring resistance group; and a correction resistance group comprising a plurality of correction resistance being connected to the measuring resistance group for correcting variations in resistance value of the each measuring resistance, so that variation in resistance value of the measuring resistance group is detected on the basis of a current accumulated in the integration circuit, wherein there is further provided; a first bias circuit being connected to the measuring resistance group and being provided with a reference resistance which is equal in resistance temperature coefficient to the measuring resistance; a second bias circuit being connected to the cancel resistance and being provided with another reference resistance which is equal in resistance temperature coefficient to the cancel resistance; and a third bias circuit being connected to the correction resistance and being provided with still another reference resistance which is equal in resistance temperature coefficient to the correction resistance, and the first bias circuit comprises means for applying its output voltage to the measuring resistance group, the second bias circuit comprises means for applying its output voltage to the cancel resistance, and the third bias circuit comprises means for applying its output voltage to the correction resistance.

The integration circuit comprises first and second bipolar transistors with collectors connected with each other and an integration capacitor connected to the collectors, the first bipolar transistor has an emitter connected to the cancel resistance and a base connected to the second bias circuit, and the second bipolar transistor has an emitter connected to the measuring resistance group and a base connected to the first bias circuit.

The first bias circuit is provided with a temperature-compensated constant current circuit, a reference resistance being connected to the constant current circuit and being equal in resistance temperature coefficient to the measuring resistance, and a filter being connected to the reference resistance for removing noises from a voltage generated from the reference resistance.

The second bias circuit is provided with a temperature-compensated constant current circuit, a reference resistance being connected to the constant current circuit and being equal in resistance temperature coefficient to the cancel resistance, and a filter being connected to the reference resistance for removing noises from a voltage generated from the reference resistance.

The third bias circuit is provided with a temperature-compensated constant current circuit, a reference resistance being connected to the constant current circuit and being equal in resistance temperature coefficient to the correction resistance, and a filter being connected to the reference resistance for removing noises from a voltage generated from the reference resistance.

The constant current circuit is provided with a plurality of resistance connected in parallel to each other, a plurality of switching means connected to each of the resistances, and a shift resistor connected to the switching means.

Each of the plural resistances comprises a diffusion resistance.

A plurality of the read-out circuit is provided and one of the read-out circuits is a read-out circuit having no sensitivity to the physical value and a bias is applied to the measuring resistance group and the cancel resistance of other read-out circuits, so that an output from the read-out circuit free of sensitivity is constant.

A plurality of the read-out circuit free of the correction resistance group is provided, and each of the read-out circuits is provided with the first bias circuit provided with the correction resistance group.

In the semiconductor device, only a single measuring resistance may be provided for actually detecting a physical value, whilst the correction resistance group and the third bias circuit are not provided.

Said semiconductor device is any one of an infrared ray sensor, a microwave/milliwave detector, a temperature sensor, a magnetic sensor, a pressure sensor, a gas sensor and a flow sensor.

As structured in the present invention, variation in sensitivity among pixels caused by variation in temperature of the device can be suppressed to about 1/100 of the conventional one. A resistance is connected to the emitter of the bipolar transistor to obtain a low noise.

Application of the voltage to the measuring resistance such as the bolometer prevents an influence by self-heat generation by the measuring resistance. The dynamic range of the signal processing circuit including the integration circuit has a margin that allows a circuit gain to increase. Particularly, the increase in the gain of the integration circuit on the first stage reduces the input-conversion noise, whereby S/N is largely improved.

Further, it is possible to add a function of bias setting in digital with keeping a low drift and a low noise. This structure is simple and a high performance semiconductor device can be realized with a low cost.

DESCRIPTION OF THE PREFERRED EMBODIMENTS

Subsequently, practicable modes of the present invention will be described by using drawings.

Figure 1:
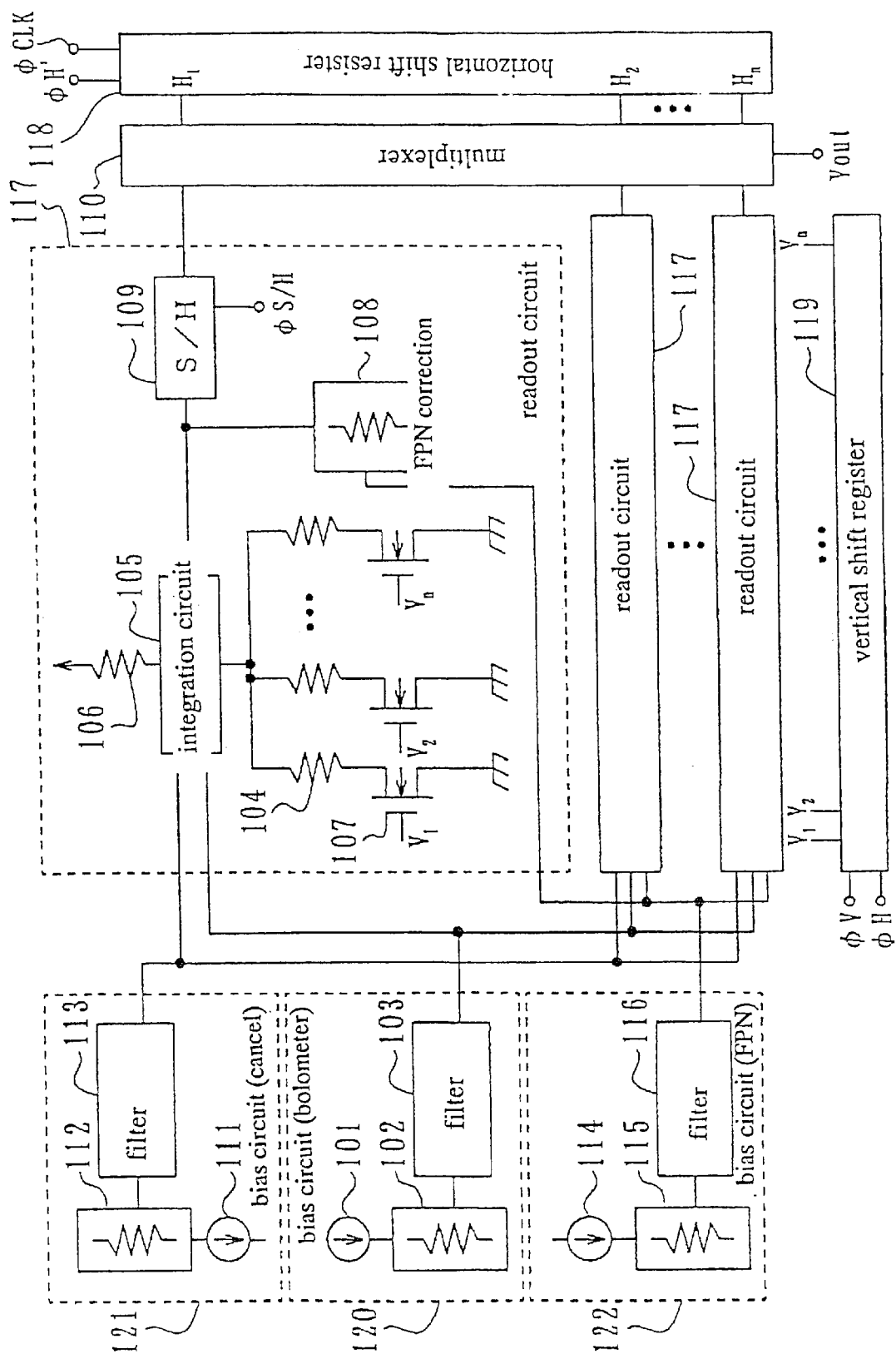
FIG. 1 is a circuit diagram showing a first embodiment of the present invention.

FIG. 1 is a block diagram illustrative of a thermal infrared ray image pick-up device showing a first embodiment in accordance with the present invention.

As shown in this drawing, the thermal infrared ray image pick-up device is provided with a plurality of readout circuits 117, a bias circuit 120 for a bolometer, a bias circuit 121 for a cancel resistance, a bias circuit 12 for an FPN correction circuit, a multiplexer 110, a horizontal shift resistor 118 and a perpendicular shift resistor 19.

The bias circuit 120 comprises a constant current circuit 101, a reference resistance circuit 102, and a filter 103. The bias circuit 121 comprises a constant current circuit 111, a reference resistance circuit 112, and a filter 113. The bias circuit 122 comprises a constant current circuit 114, a reference resistance circuit 115, and a filter 116.

The readout circuit 117 comprises an integration circuit 105 connected to the bias circuits 120 and 121, a cancel resistance 106 connected between the integration circuit 105 and a power source, n (n: natural number) of bolometer 104 connected to the integration circuit 105, n of pixel switches 107 comprising NMOS transistors connected between the bolometers 104 and the ground, a sample hold circuit 109 connected to the integration circuit 105, and an FPN correction circuit 108 connected to an output of the integration circuit 105 and also connected to the bias circuit 122.

Figure 14:
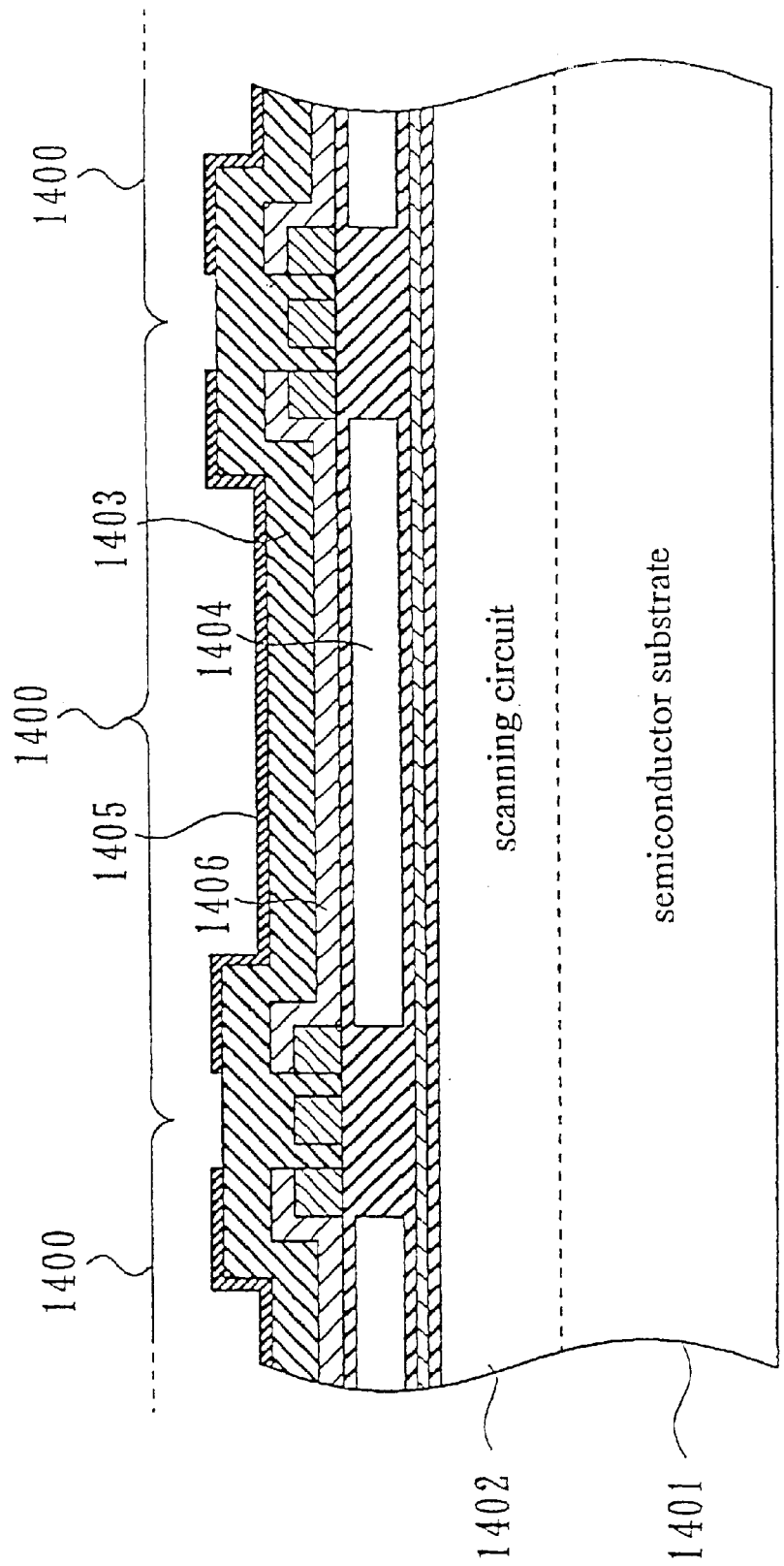
FIG. 14 is a cross sectional view illustrative of a conventional thermal infrared ray image pick-up device.
Figure 15:
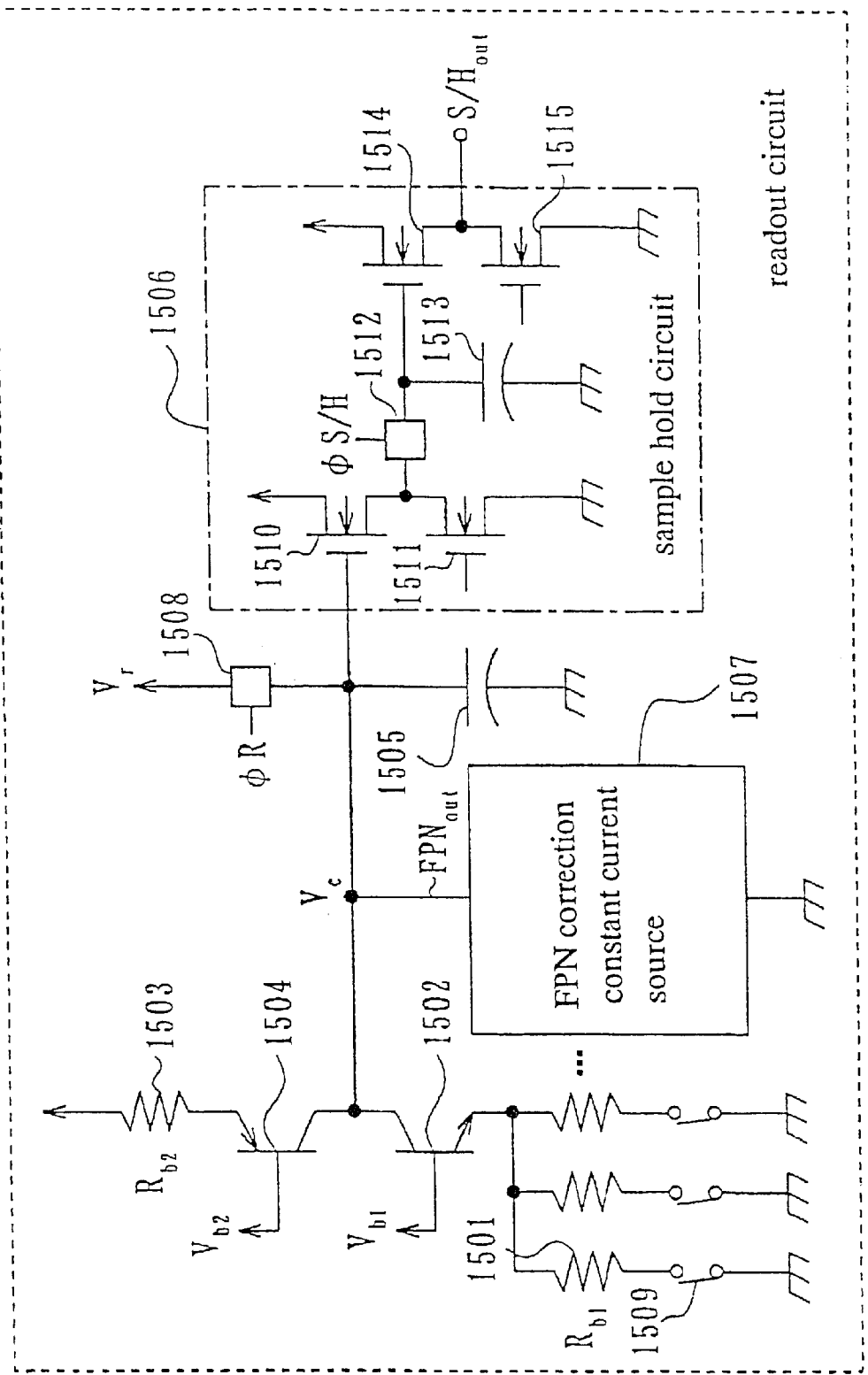
FIG. 15 is a circuit diagram illustrative of a readout circuit of the thermal infrared ray image pick-up device of FIG. 14.

Similarly to the prior art shown in FIGS. 14 and 15, the bolometer 104 is in the form of a diaphragm for each pixel for conversion of variation in incident infrared ray into current variation.

The pixel switch 107 comprises an NMOS transistor formed under the diaphragm to serve for deciding select/non-select of the bolometer 104.

The cancel resistance 106 is connected through the integration circuit 105 to the bolometer 104 for canceling the bias component of the current flowing through the bolometer 104.

The FPN correction circuit 108 is for reducing variation in current flowing through the bolometer 104.

The integration circuit 105 is for integrating currents flowing through the bolometer 104, the cancel resistance 106 and the FPN correction circuit 108.

The sample hold circuit 109 is for sampling the output from the integration circuit 105 and holding the same.

The pixels, each of which comprises the bolometer 104 and the pixel switch 107, are arranged in the form of one-dimension or two-dimension over a semiconductor substrate 1401 shown in FIG. 14. For example, in a "y-direction", such pixels are formed, so that each pixel is connected to the single integration circuit 105. This integration circuit 105 is connected with the cancel resistance 106, the FPN correction circuit 108 and the sample hold circuit 109 to form a single read-out circuit 117.

For the one-dimensional thermal infrared ray image pick-up device, one of the readout circuit 117 is provided. For the two-dimensional thermal infrared ray image pick-up device, a plurality of the readout circuit 117 is aligned in an "x-direction", and further multiplexers are provided in the vicinity of the readout circuit 117 to switch optionally signals of the readout circuit 117.

The horizontal shift resistor 118 selects one of the plural readout circuits 117 under the control to the multiplexer 110.

On the other hand, the perpendicular shift resistor 119 is used both in the one-dimension and the two-dimension to select one of the bolometers 104 connected to the individual integration circuits 105 under the control to the pixel switch 107.

The operation of this embodiment will be described.

The bias circuit 120 provides a bias through the integration circuit 105 to the bolometer 104. The temperature-compensated constant current circuit 101 generates a constant current having a small temperature dependency. This constant current is supplied to the reference resistance circuit 102. The reference resistance circuit 102 has a resistance R1 with the same temperature coefficient of resistance (hereinafter referred to as "TCR") as the bolometer and receives a temperature-compensated constant current I1 thereby to output a voltage V1 with the same temperature coefficient as "TCR".

This is cased by the fact that if the temperature dependency of I1 is made smaller than V1=I1×R1, then V1 has the same temperature coefficient as R1. The voltage V1 from the reference resistance circuit 102 is applied through the filter 103 to the bolometer 104 connected to the integration circuit 105. A current I11 with a small temperature dependency flows through the bolometer 104 because if the resistance value of the bolometer 104 is R11, then I11=V1/R11=I1× R1/R11, whereby R1 and R11 are the same in TCT as each other.

The bias circuit 121 provides a bias through the integration circuit 105 to the cancel resistance 106. The temperature-compensated constant current circuit 111 provides a constant current with a small temperature dependency to the reference resistance circuit 112. This reference resistance circuit 112 has the same resistance of TCR as the cancel resistance 106, and receives the temperature-compensated constant current thereby to output a voltage with a temperature coefficient as the TCR of the cancel resistance 106. The voltage outputted from the reference resistance circuit 112 is applied through the filter 113 to the cancel resistance 106, so that a current with a small temperature dependency flows through the cancel resistance 106.

The bias circuit 122 provides a bias to the FPN correction circuit 108. The temperature-compensated constant current circuit 114 outputs a constant current with a small temperature dependency. This constant current is supplied to the reference resistance circuit 115. This reference resistance circuit 115 has the same resistance of TCR as the correction resistance of the FPN correction circuit 108 and receives the temperature-compensated constant current, thereby to output a voltage with the same temperature coefficient as the TCR of the correction resistance of the FPN correction circuit 108. The voltage outputted from the reference resistance circuit 115 is applied through the filter 116 to the correction resistance of the FPN correction circuit 108, whereby the FPN correction circuit 108 outputs a current with a small temperature dependency.

As in FIG. 1, the temperature-compensated constant current circuit 101, 111 and 114 are independent from each other. It is, however, possible to use a single temperature-compensated constant current circuit through current mirror circuits to generate three constant currents.

The configurations of the bias circuits 120, 121 and 122 as well as the read out circuit 117 in FIG. 1 will be described in detail.

Figure 2:
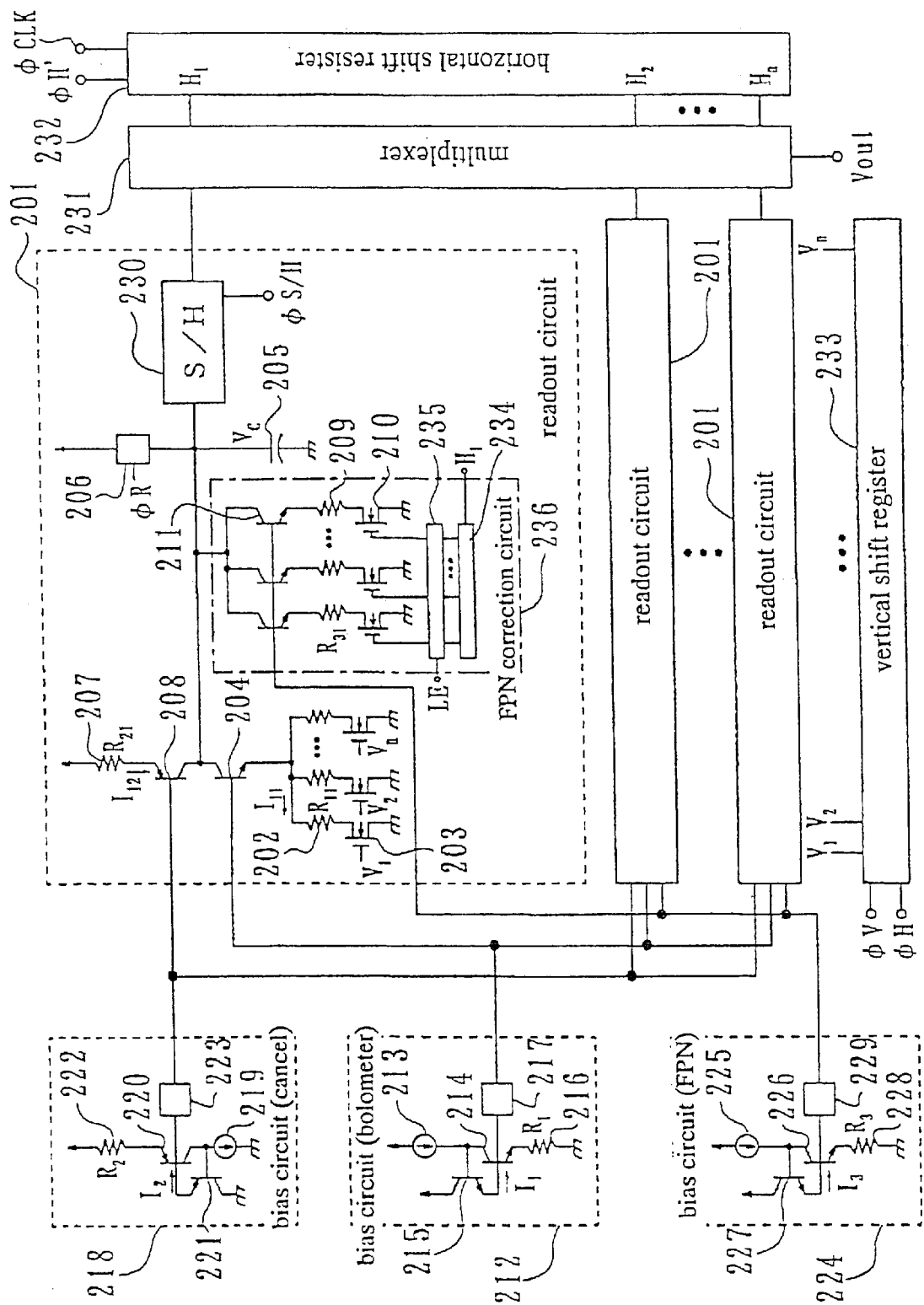
FIG. 2 is a concrete circuit diagram of a thermal infrared ray image pick-up device of FIG. 1.
Figure 3:
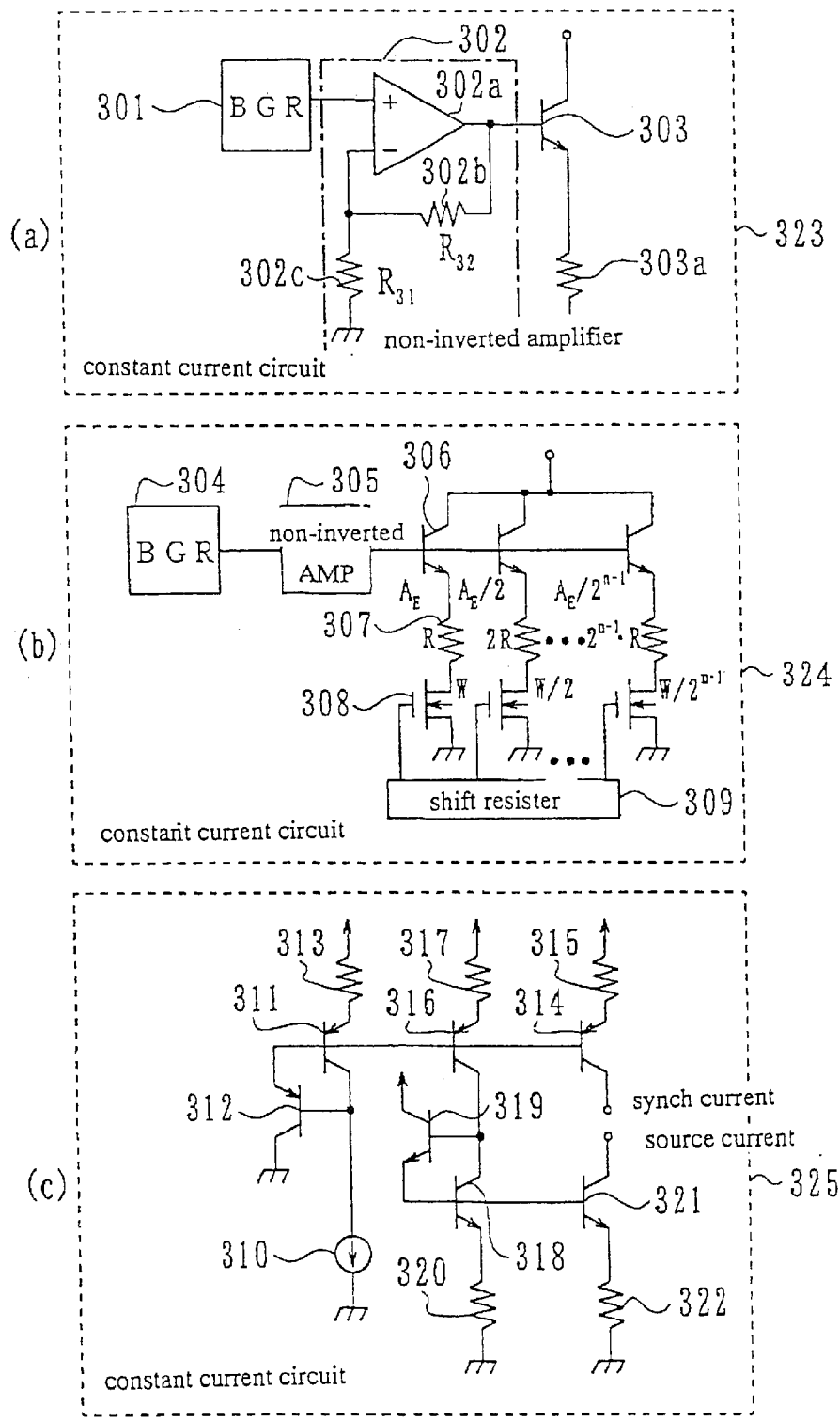
FIGS. 3($a$), ($b$) and ($c$) are circuit diagrams of temperature-compensated constant current circuits.
Figure 4:
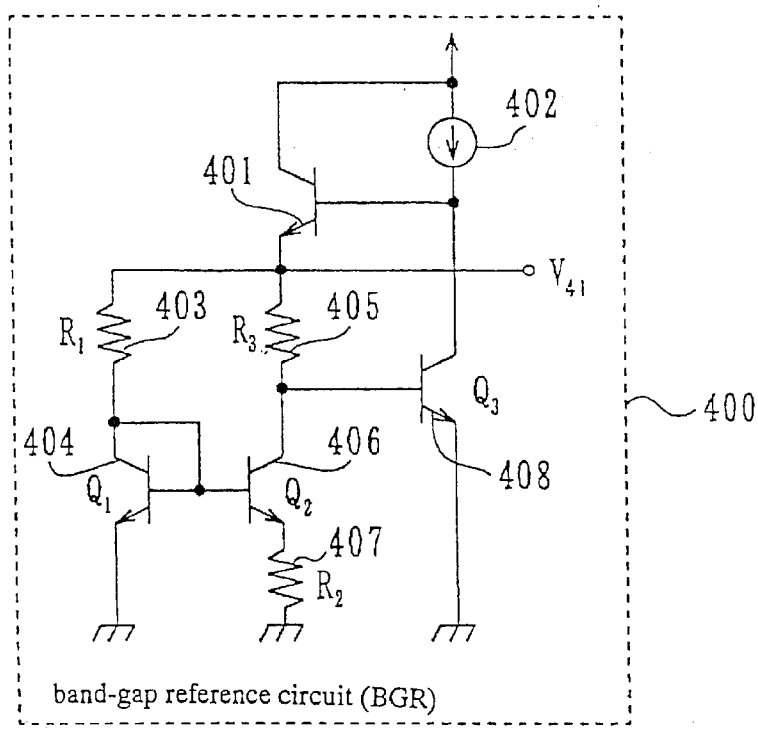
FIG. 4 is a circuit diagram illustrative of a band-gap reference circuit.

FIGS. 2, 3 and 4 are concrete circuits as in the embodiments of the present invention.

The circuitries shown in the drawings are preferably formed on the same semiconductor substrate for good matching in temperature between the devices. It is, however, possible to use optionally discrete parts as variable-resistance as adjusting devices, and a large capacity capacitance. In accordance with the specification requirement for the temperature drift, Peltier device may be utilized to keep the semiconductor substrate temperature in constant.

FIG. 2 is a circuit diagram illustrative of the thermal infrared ray image pick-up device as in FIG. 1.

As shown in the drawing, the thermal infrared ray image pick-up device of this embodiment is provided with a plurality of readout circuits 201, a bias circuit 212 for a bolometer, a bias circuit 218 for a cancel resistance, a bias circuit 224 for an FPN correction circuit, a multiplexer 231, a horizontal shift resistor 232 and a perpendicular shift resistor 233.

The bias circuit 212 comprises a constant current circuit 213, a reference resistance circuit 214, a resistance 216 and a filter 217. The bias circuit 218 comprises a constant current circuit 219, PNP transistors 220 and 221, a resistance 222, and a filter 223. The bias circuit 224 comprises a constant current circuit 225, PNP transistors 226 and 227, a resistance 228, and a filter 229.

The readout circuit 201 comprises a resistance 207, a PNP transistor 208, an NPN transistor 204, a bolometer 202, a pixel switch 203, an FPN correction circuit 236, a reset switch 206, an integration capacitor 205 and a sample hold circuit 230.

In the read out circuit 201 as structured above, similarly to the prior arts in FIGS. 14 ad 15, the NPN transistor 204 has an emitter connected to a plurality of (number "n" (natural number)) of bolometers 202 and a collector connected to the integration capacitor 205. Namely, the variation in resistance of the bolometer 202 is converted into variation in current that will be accumulated into the integration capacitor 205.

The pixel switch 203 is connected between the bolometer 203 and the ground so as to select one or more of the plural bolometers 202 connected to the NPN transistor 204.

The PNP transistor 208 has an emitter connected to the cancel resistance 207 and a collector connected with the integration capacitor 205 to remove the bias component from the current flowing through the bolometer 202.

The FPN correction circuit 236 is provided with a plurality of NPN transistors 211 with gates connected to each other, resistances 209 connected to emitters of the NPN transistors 211, NMOS transistors 210 connected to the each resistances 209, and FPN data buffers 235 and 234 connected to the bases of all of the NMOS transistors 210.

The single NPN transistor 211, the single FPN correction resistance 209 and the single NMOS transistor 210 form one set of the constant current source. Plural sets of the constant current sources different in current setting can suppress variation in resistance value of the bolometers 202. The variations in resistance of the bolometers 202 are so called generally as fixed pattern noise, and will hereinafter be referred o as PFN.

The current value setting of the plural constant current sources may be set in digital. Namely, in accordance with the variation in resistance of the bolometers 202, a desirable one of the plural NMOS transistors 210 is selected to operate ON/OFF thereof so as to vary a synthesis resistance and also to reduce variation in integration current flowing through the integration capacitor 205 among pixels. As a result, the majority of bias component from the integration current and variations among the pixels can be removed.

The remaining component includes signal components and the bias and variation among the pixels which can be removed, and the remaining parts are applied for a predetermine term to the integration capacitor 205 and accumulated therein.

The sample hold circuit 230 is to conduct sampling the voltage of the integration capacitor 205 after having acculturated the current for a predetermined time period and hold the same temporary. Accordingly, it is possible to allow the integration circuit to commence the next integration before reading out the signal for making the integration time longer. The long integration time makes the noise frequency band narrow to reduce the noise.

The reset switch 206 is connected to the integration capacitor 205 for resetting the integration capacitor 205 after sampling at a constant voltage. The reset is carried out by applying an external reset pulse ΦR.

As shown in FIG. 1, the pixels comprising the bolometers 202 and the NMOS transistors 203 are aligned in the form of one-dimensional or two-dimensional over the semiconductor substrate shown in FIG. 15. For example, the pixels are formed in the Y-direction to be connected to the single NPN transistor 204. For the one-dimensional thermal infrared ray image pick-up device, one of the readout circuit 201 is provided. For the two-dimensional thermal infrared ray image pick-up device, a plurality of the readout circuit 201 is aligned in an "x-direction", and further multiplexers 231 are provided in the vicinity of the readout circuit 201 to switch optionally signals of the readout circuit 201.

The horizontal shift resistor 232 selects one of the plural readout circuits 201 under the control to the multiplexer 231.

On the other hand, the perpendicular shift resistor 233 selects one or some of the bolometers 202 connected to the NPN transistor 204 under the control to the pixel switch 203.

In the bias circuit 212, the temperature-compensated constant current circuit 213 outputs a constant current I1 with a small temperature dependency. The NPN transistor 214 is applied with this constant current I1 and an emitter thereof is connected to a resistance 216 having the same TCR as the bolometer 202. The base and collector of the NPN transistor 214 are connected to the emitter and the base of the other NPN transistor 215 respectively so that the collector of the NPN transistor 215 is connected to the power source.

The NPN transistor 214 is required to have the same structure and size as the NPN transistor 204 connected to the bolometer 202. The base of the NP transistor 214 is connected through the filter 217 to base of the NPN transistor 204 in the readout circuit 201.

The base of the NPN transistor 214 receives a constant current I1 temperature-compensated to output a voltage of V1=I1×R1+VBE11. R1 is a resistance value of the resistance 216. VBE11 is a base-emitter voltage of the NPN transistor 214. Application of V1 to the base of the NPN transistor 204 causes the bolometer 202 to be applied with a voltage V1−VBE12. The VBE12 is a base-emitter voltage of the NPN transistor 204. Since the NPN transistors 204 and 214 are the same in structure and size as each other, VBE11 is almost equal to VBE12.

As a result, the bolometer 202 is applied with a voltage of I1×R1. The bolometer 202 is applied with a current of I11=I1×R1/R11, provided that R11 is the resistance of the bolometer 202. Since the temperature dependency of I1 is small and R1 and R11 are the same in TCR as each other, the bolometer 202 is applied with a current I11 with a small temperature dependency.

By the way, the circuit is operable if the NPN transistor 215 is eliminated from the configuration of FIG. 2 and the base and the collector of the NPN transistor 214 are connected to each other.

The NPN transistor 215 supplies a majority part of the base current of the NPN transistor 214 through the power source, whereby the majority of the current I1 of the temperature-compensated constant current circuit 213 flows to the collector of the NPN transistor 214. The collector current of the NPN transistor 204 provided with the same base voltage is highly accurate as I1, and the temperature-dependency of the collector current of the NPN transistor 204 is improved.

The NPN transistor 215 is added to reduce the influence of 1/f noise extending in the NPN transistor 214. This point was confirmed by the simulation by the inventor. The NPN transistor 215 is effective to drop the impedance of the base of the NPN transistor 214.

The resistance 216 may be the same material and the same structure as the bolometer 202. The current is always applied in use differently from the bolometer, for which reason if the resistance is formed over the diaphragm thermally isolated whereby the self-heat generation of the bolometer is excessive. In worst case, the resistance is burned out. It may be considered that the resistance is formed over the dummy layer but the dummy layer is not etched.

If the resistance 216 is the same in resistance value as the bolometer 202, then I1 and I11 are the same as each other, whereby VBE11 and VBE12 are equal to each other accurately. In case of the two-dimensional sensor, internal variations exist in x and y directions, it is difficult that R1 is equal to R11. In this case, in order that the both are as equal to each other as possible, it is possible that the resistance 216 is placed in the vicinity of the center of the bolometers aligned in the x-direction or in the y-direction to obtain better results.

In order to make R1 equal to R11, it is possible to use a connection of a plurality of bolometers 202 as the resistance 216, whereby the difference between R1 and R11 is relaxed by in the average. Three sets of parallel connections of three bolometers 202 are connected in series to obtain the same resistance value as the bolometer 202 and the difference between R1 and R11 is relaxed by in the average.

The use of the series connections of the plural bolometers 202 provides an effect of 1/f noises. This is cased by the fact that 1/f noise is generally inversely proportional to the square-root of the total number of carriers. For example, if the nine of the bolometer are connected, then 1/f noise is reduced to one third.

Even if the resistance 216 could not be made identical in resistance value with the bolometer 202, it is possible to properly set the sizes of the NPN transistors 204 and 214 to obtain the same effects as described above. For example, the resistance 216 has a resistance value of "a" times of the bolometer 202, whereby an emitter area of the NPN transistor 214 connected to the resistance 216 is 1/a times of the emitter area of the NPN transistor 204 connected to the bolometer 202, in order to make the VBE11 highly equal to VBE12.

This is cased by the following reasons. A relationship between the base current IB and the base-emitter voltage VBE is given as follows where AE is the emitter area, IBO is the proportional coefficient, q is the charge element, k is the Boltzmann's constant, and T is the absolute temperature.

$$IB = AE \cdot IBO \cdot Exp[qVBE/k/T] \quad (1)$$

If the resistance becomes a-times, then the IB is 1/a times, wherein AE is made into 1/a times, then the same VBE can be obtained.

Similarly, in the bias circuit 218, the temperature-compensated constant current circuit 219 outputs a constant current I2 with a small temperature dependency. The PNP transistor 220 has a collector applied with this constant current and an emitter connected to the resistance 222 having the same TCR as the cancel resistance 207. The base and the collector thereof are connected to the emitter and the base of the other PNP transistor 221 respectively. The collector of the PNP transistor 221 is connected to the ground.

The PNP transistor 220 is the same in structure and size as the PNP transistor 208 connected to the cancel resistance 207. The base of the PNP transistor 220 is connected through the filter 223 to the base of the PNP transistor 208 in the readout circuit 201.

The base of the PNP transistor 220 receives the temperature-compensated constant current 12 to output the voltage V2=I2×R2+VBE21, R2 is the resistance value of the resistance 222 and VBE21 is the base-emitter voltage of the PNP transistor 220. If V2 is applied to the base of the PNP transistor 208, then the cancel resistance 207 is applied with the voltage V2−VBE22, where VBE22 is the base-emitter voltage of the PNP transistor 208. The PNP transistors 208 and 220 are the same in structure and size as each other, so that VBE21 is almost the same as VBE22.

The cancel resistance 207 is applied with the voltage of I2×R2 and then applied with a current of I21=I2×R2/R21, where R21 is the resistance value of the cancel resistance 207. Since the temperature dependency of I2 is small and R2 is the same in TCR as R21, the cancel resistance 207 is applied with a current I12 with the small temperature dependency.

By the way, the PNP transistor 221 provides the same effect as the NPN transistor 215. The resistance 222 and the cancel resistance 207 are preferably the same material and structure so as to be made equal in resistance value to each other. It is possible that the resistance 222 is "a" times of the cancel resistance 207 and the emitter area of the PNP transistor 220 is 1/a times of the emitter area of the PNP transistor 208.

In the bias circuit 224, the temperature-compensated constant current circuit 225 outputs a constant current I3 with a small temperature dependency. The NPN transistor 226 has a collector connected to this constant current output and an emitter connected to the resistance 228 having the same TCR as one of the FPN correction resistance 209. The base and the collector thereof are connected to the emitter and the base of the other NPN transistor 227 and the collector of the NPN transistor 227 is connected to the power of the collector.

The NPN transistor 226 is the same in structure and size as the NPN transistor 211 connected to the FPN correction resistance 209. The base of the NPN transistor 226 is connected through the filter 229 to the base of the NPN transistor 211 in the readout circuit 201.

The base of the NPN transistor 226 receives the temperature-compensated constant current 13 to output the voltage V3=I3×R3+VBE31, R3 is the resistance value of the resistance 228 and VBE31 is the base-emitter voltage of the NPN transistor 226. If V3 is applied to the base of the NPN transistor 211, then the FPN correction resistance 209 is applied with the voltage V3−VBE32, where VBE32 is the base-emitter voltage of the NPN transistor 226. The NPN transistor 221 and 226 are the same in structure and size as each other, so that VBE31 is almost the same as VBE32.

The FPN correction resistance 209 is applied with the voltage of I3×R32 and then applied with a current of I31=I3×R3/R31, where R31 is the resistance value of the FPN correction resistance 209. Since the temperature dependency of I3 is small and R3 is the same in TCR as R31, the FPN correction resistance 209 is applied with a current I31 with the small temperature dependency.

The NPN transistor 227 provides the same effect as the NPN transistor 215 in the bias circuit 212. The resistance 228 and the FPN correction resistance 209 are preferably the same material and structure so as to be made equal in resistance value to each other. It is possible that the resistance 228 is "a" times of the FPN correction resistance 209 and the emitter area of the NPN transistor 226 is 1/a times of the emitter area of the NPN transistor 211.

The following is an example of the temperature-compensated constant current circuit 219.

FIG. 3 is a circuit diagram illustrative of a concrete circuit of the constant current circuit.

For example, as in FIG. 3(a), the output of the temperature-compensated constant current circuit 301 is connected to an input of the non-inverted amplifier 302 and further the output of the non-inverted amplifier 302 is connected to a base of the NPN transistor 303 and its emitter is connected to the diffusion resistance 303a. The non-inverted amplifier 302a comprises an operational amplifier 302a, and resistances 302a and 302c.

As the temperature-compensated constant current circuit 301, a band-gap reference circuit shown in FIG. 4 may preferably be used.

FIG. 4 is a circuit diagram illustrative of a band-gap reference circuit.

As shown in the drawing, the band-gap reference circuit 400 comprises a constant current source 402, an NPN transistor 401 with a base connected to this constant current source 402, resistances 403 and 404 commonly connected to an emitter of the NPN transistor 401, NPN transistors 404 and 406 connected to the resistances 403 and 405 respectively, a resistance 407 connected between the NPN transistor and the ground, and an NPN transistor 408 having a base connected to the resistance 405, a collector connected to the constant current source 402 and an emitter connected to the ground.

In this band-gap reference circuit 400, emitter currents IE1, and IE2 of the NPN transistor 404 and the NPN transistor 406 are given as follows.

$$IE2 \cdot IB = (kT/q)\ln(A1\ IE1/A2/IE2) \tag{2}$$

where A1 and A2 are values decided by the emitter areas of the NPN transistors 404 and 406, k is the Boltzmann's constant, T is the absolute temperature, and q is the charge element.

The output voltage V41 is the sum of the base-emitter voltage VBE3 of the NPN transistor 408 and a voltage across opposite sides of the resistance 405(R3) and is represented as follows.

$$V41 = VBE3 + (R2/R1) \cdot (kT/q)\ln(A1\ IE1/A2/IE2) \tag{3}$$

The first and second items on right side of this equation (3) have inverted temperature coefficients to each other. It is possible to so select the circuit constant as to extremely reduce the temperature coefficient of V41.

In general such the band-gap reference circuit, a temperature coefficient about 0.01%/° C. can be obtained at an output voltage of about 1.35V The output from the temperature-compensated constant current circuit 301 of FIG. 3(a) is converted by the non-inverted amplifier 302 into the necessary voltage in the NPN transistor 303 and the diffusion resistance 303a. A gain G of the non-inverted amplifier 302 is decided by R31 and R32 to be G=1+R32/R31. Making R31 and R32 identical with each other in temperature coefficient reduces the temperature coefficient of the non-inverted amplifier 302. It is preferable that R31 and R32 are identical with each other in temperature, where both are formed on the same semiconductor substrate or a group resistance, a potentiometer and a variable resistance are utilized.

The voltage V32 outputted from the non-inverted amplifier 302 is converted by the NPN transistor 303 and the diffusion resistance 303a into the current I31 with the small temperature dependency. Assuming that VBE is the base-emitter voltage of the NPN transistor 303 and R33 is the resistance value of the diffusion resistance 303a, the following is given.

$$I31 = (V32 - VBE)/R33 \tag{4}$$

In the general silicon IC, the temperature coefficient β of VBE is about −2 mV/° C., the temperature coefficient γ of R33 is about 0.2 mV/° C. if the P-(P-type low concentration) diffusion resistance is used, whereby proper selection of the circuit constant makes the temperature coefficient of I31 zero.

If the temperature coefficient of V32 is δ mV/° C., conditions for making the temperature coefficient of I31 zero are as follows.

$$R33 = (\delta - \beta)/\gamma/I31 \tag{5}$$

If I31 is about 200 μA and δ is so small as approximately ignore, R33 is set about 5 kΩ to make the temperature coefficient of I31 almost zero. From the equation (4), V32 is 1.7V provided that VBE is 0.7V Accordingly, if the band-gap reference circuit 400 is used as the temperature-compensated constant current circuit 301, the gain of the non-inverted amplifier 302 becomes 1.7/1.35=1.26. Depending upon the circuit constant, the gain may become 1, whereby the non-inverted amplifier 302 may be omitted. It is also possible to change the non-inverted amplifier 302 into other means for converting the voltage.

As can be seen from the equation (5), even if the temperature coefficient of the temperature-compensated constant current circuit 301 is not small, proper selection of the circuit constant can make the temperature coefficient of I31 small. If the circuit constant is fixed for mass production, variation in δ causes variation in I31, for which reason the absolute value of δ is preferably small.

The structure of connecting the diffusion resistance 303a to the emitter of the NPN transistor 303 is effective to reduce short noises of the NPN transistor, the Johnson noise of the base resistance (rbb) the influence of the circuit noise to the base.

Figure 5:
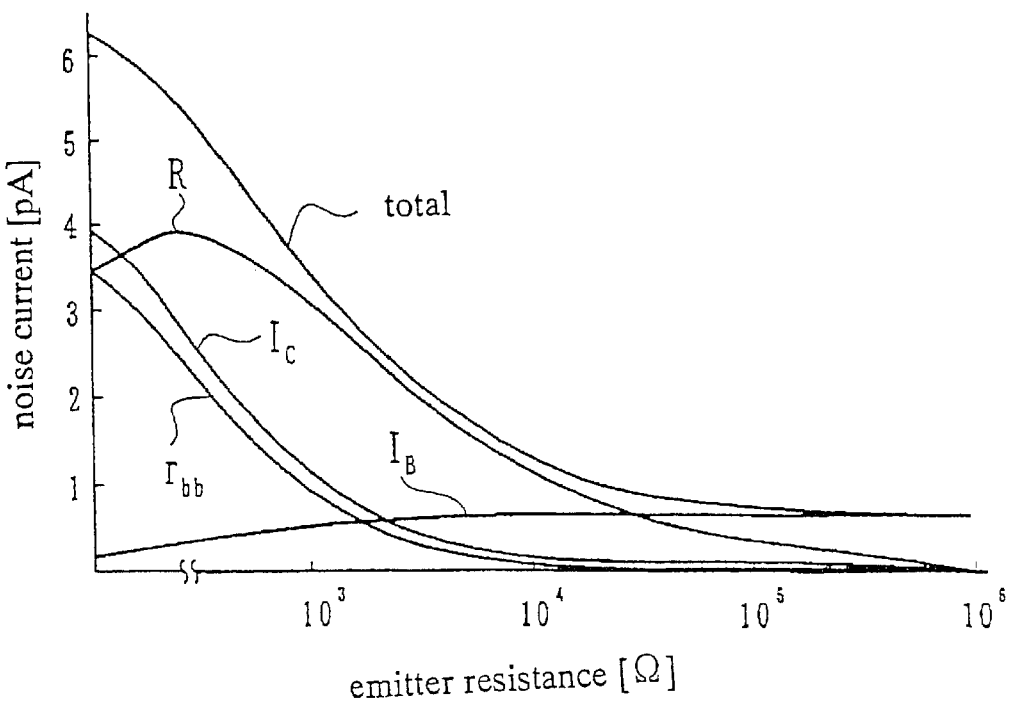
FIG. 5 is a graph showing a noise current of a transistor in this embodiment.

FIG. 5 is a graph showing a current noise flowing through the collector if he diffusion resistance 303a varies.

In this drawing, R is the Johnson noise of the diffusion resistance 303a, Ic is the shot noise of the collector current. IB is the shot noise of the base current, rbb is the Johnson noise of the base resistance, the total represents the sum of those noises, wherein the collector current is 100 μA and the base resistance is 100 Ω, and this represents that the current through the bolometer is about 100 μA.

As can be apparent from the drawing, the total noise is increased by increasing the emitter resistance and is converged into a lower limit noise current. As the emitter resistance value is not less than 100 Ω, the total noise is decreased, but as the emitter resistance value is not less than about 3 Ω, the total noise can be suppressed to be about double of the lower limit noise current. If the collector current is 100 Ω and the emitter resistance is not more than 50 KΩ, the voltage across opposite sides of the emitter resistance is not more than 5 Ω, whereby the circuit may be considered to be the normal BiCMOS circuit.

As the emitter resistance value is not more than. 30 KΩ, the voltage across the opposite sides of the emitter resistance is not more than 3V, whereby the dynamic range has a margin. The emitter resistance value is 100 Ω–50 KΩ, preferably 3 KΩ–30 KΩ.

The structure of connection with the emitter resistance provides an effect of the noise reduction. The above range of the resistance slightly varies depending upon the current through the collector. As the collector current is increased, the preferable resistance value is likely to become small.

The bias circuit connected to the integration circuit needs a low noise because the integration circuit processes faint signals.

It is possible to remove the high frequency component of the noise by use of the low pass filter. However, the simple use of the low pass filter can remove the high frequency component but it is difficult to remove the low frequency noise particularly 1/f noise.

Consequently, the above structure of connecting the resistance to the emitter is suitable for the requirement for the low noise as can reduce the noises including 1/f existing in the circuitry.

If the current value of the temperature-compensated constant current 219 is optionally changed, the structure as in FIG. 3(b) is preferable.

As shown in this drawing, the constant current circuit 324 is provided with a constant current circuit 324, a constant voltage circuit 304, a non-inverted amplifier 305, n of NPN transistors 306, a plurality of resistances 307 and NMOS transistors 308 connected to the individual NPN transistors 306, and shift resistors 309 connected to the individual NMOS transistors 308.

The output of the temperature-compensated constant current circuit 304 is connected to the input of the non-inverted amplifier 305, whilst the output of the non-inverted amplifier 305 is connected to the bases of the plural NPN transistors 306. The resistances 307 are connected to the emitters of the NPN transistors 306 and those resistance values are set to be different as R, 2R, 4R, - - - $2^{n-1}$R.

The emitter areas of the individual NPN transistors 306 are inversely proportional to the resistance values of the resistances 307 and are set to be AE, AE/2, AE/4, - - - AE/$2^{n-1}$. NMOS transistors 308 are connected between the individual resistances 307 and the ground, and those gate widths are inversely proportional to the resistance values of the resistances 307 and to be set as W, W/2, W/4, - - - W/$2^{n-1}$. The shift resistors 309 are connected to the gates of the individual NMOS transistors 308 to control ON/OFF of the transistor.

The currents flowing through the collectors of the individual NPN transistors 306 vary in binary as inversely proportional to the resistance values of the resistances 307.

The reason why the emitter areas vary in binary is as follows.

If the resistance values of the resistances 307 vary in binary, the base currents of the individual NPN transistors also vary almost inversely proportional thereto. On the basis of the equation (1), the emitter areas AE of the individual transistors vary inversely proportional to the resistance values so that VBE is the same among the individual transistors. Voltages applied to the individual resistances 307 are accurately identical with each other and an error is reduced.

On the other hand, the reason why the gate width of the NMOS transistor 308 varies inversely proportional to the resistance value of the resistance 307 is as follows.

If VGS is the gate-source voltage, VT is the gate threshold voltage, IDO is the proportional coefficient and W is the gate width, a relationship of the drain current ID and the drain-source voltage VDS is given as follows.

$$ID = W\ IDO[(VGS-VT)VDS-VDS^2/2] \quad (6)$$

If the resistance value of the resistance 307 varies in binary, the drain currents of the individual NMOS transistors vary almost inversely proportional thereto. The gate widths of the NMOS transistors 308 vary inversely proportional to the resistance values of the resistances 307, so that the drain-source voltages are identical among the individual transistors.

The voltages applied to the individual resistances 307 are accurately identical with each other thereby reducing the error. If the drain-source voltage is so small as ignore as compared to the voltage across the opposite sides of the resistance 307, no problem occurs even such variation is not made.

In this circuit, in accordance with the required currents for the constant current circuit 219, data are sent to the shift resisters 309 to control ON/OFF of the NMOS transistors 308 thereby obtaining temperature-compensated constant current which varies in binary. Namely, it is possible to set in digital the temperature-compensated constant current value.

The resolving power of the obtained constant current is almost the constant current of LSB. The maximum current of the obtained constant current is about two times of the constant current value of MSB. For example, if the constant current of MSB is 200 μA and the eight staged constant current circuit is structured, LSB is 1.56 μA and the resolving power of about 1.56 μA and the maximum current is about 400 μA. This resolving power is ideal but actually receives an influence of error in constant current value of each bit.

FIGS. 3(a) and (b) show a circuit for obtaining currents (synch current) flowing into the constant current circuit. By contrast, FIG. 3(c) shows a current obtaining a current (source current) flowing from the constant current circuit.

Even in FIG. 3(C), the constant current circuit 325 is provided with a resistance 313, a PNP transistor with an emitter connected to this resistance 313, a PNP transistor with an emitter connected to a base of the PNP transistor 311, a PNP transistor 312 with an emitter connected to the base of the PNP transistor 311 and a base connected to the collector of the PNP transistor 311, a constant current circuit 310 connected between the collector of the PNP transistor 311 and the ground, a resistance 317, a PNP transistor 316 with an emitter connected to this resistance 317, a PNP transistor 319 with a base connected to the collector of the PNP transistor 316, a PNP transistor 318 with a base connected to the emitter of the PNP transistor 318, a resistance 320 connected between the emitter of the PNP transistor 318 and the ground, a resistance 315, a PNP transistor 314 with an emitter connected to the resistance 315 and a base connected to the base of the PNP transistor 316, a PNP transistor 321 with a base connected to the base of the PNP transistor 318, and a resistance 322 connected between the emitter of the PNP transistor 321 and the ground.

In this embodiment, as the temperature-compensated constant current circuit 310, the temperature-compensated constant current circuits as shown in FIGS. 3(a), (b) can be used.

The NPN transistor 311 has an collector connected to the constant current output and an emitter connected to the resistance 313. The base and collector are respectively connected to the emitter and base of other NPN transistor 312 and a collector of the NPN transistor 312 is connected to the ground. The base of the NPN transistor 311 is connected to the base of the NPN transistor 311 having the same structure and size. The emitter of the NPN transistor 314 is connected to the resistance 315 having the same structure and size as the resistance 313.

A source current of the same current value as the temperature-compensated constant current circuit 310 can be obtained from the collector of the NPN transistor 314.

In this case, the resistance 313 is "a" times of the resistance value of the resistance 315. The emitter area of the NPN transistor 311 is 1/a times of the emitter area of the NPN transistor. The source current may be used to the temperature-compensated constant current circuit 213 and the temperature-compensated constant current circuit 215 By adding the circuit comprising the PNP transistor 316, the NPN transistors 318 and 319 and 321, and the resistances 317, 320 and 322, it is possible to obtain the synch current with the same current value.

By utilizing the circuit, some source currents and synch currents are generated from the single temperature-compensated constant current circuit, whereby the plural constant current circuits 213, 222 and 225 may be replaced with this.

In preferable embodiments of the constant current circuits 213, 222 and 225, it is preferable to utilize the temperature-compensated constant current circuit of about 6-bits as he constant current circuit 213 deciding the current flowing through the bolometer.

The bolometer current is about 100–400 μA, assuming that the bolometer resistance is about 10 kΩ. If it is about 6 bits, it is possible to set the bolometer current with a resolving power of about 1/64.

The cancel current is as the same as the bolometer current, but problem is variation in resistance and self-heat generation of the bolometer. The bolometer with the high TCR has a negative temperature coefficient. If the self-heat generation is caused, the bolometer resistance is decreased, whereby the bolometer current i s increased by about 10–20%.

The bolometer resistance varies normally in 10%p-p, in large case, in 30%p-p. The cancel current is set in consideration of those matters, and may be set to be about 1–1.5 of the bolometer current. If the cancel current is in the range of about 1–1.5 of the bolometer current, then the variation in current of the bolometer causes variation in the cancel current.

If the gain of the integration circuit is increased, it is necessary to reduce the resolving power of setting the cancel current. If the integration time is Ts and the capacitance of the capacitor is C, the gain to the integration current of the integration circuit is Ts/C.

It is preferable as embodiment that, for example, Ts is set to be 30 μA and C is set to be 100 pF, wherein the gain is about 300,000. Even if the resolving power is 1 μA, the integration output is 0.3V It is preferable that bit number of setting the cancel current is not less than 8 bits to prevent that the resolving power for setting the cancel current occupies the dynamic range. (in this case, the cancel current varies in the range of 100–150% of the bolometer current and the resolving power os 1 μA.

In consideration of the above integration gain, about 6 bits allows the FPN correction circuit 236 reduces the resistance variation into about 1/64. The constant current circuit 225 decides the maximum current of the FPN correction circuit. The constant current circuit 225 is structured so that the bolometer current is essential, to follow the variation of the bolometer current. For example, if the variation of the bolometer is 30%p-p, the maximum current of the FPN correction circuit 236 is 30%p-p of the bolometer current.

The variation in resistance of the bolometer varies depending upon the sample, for which reason it is preferable that the about 4-bit binary constant current source is structured to allow the constant current circuit 225 to optionally set.

Figure 6:
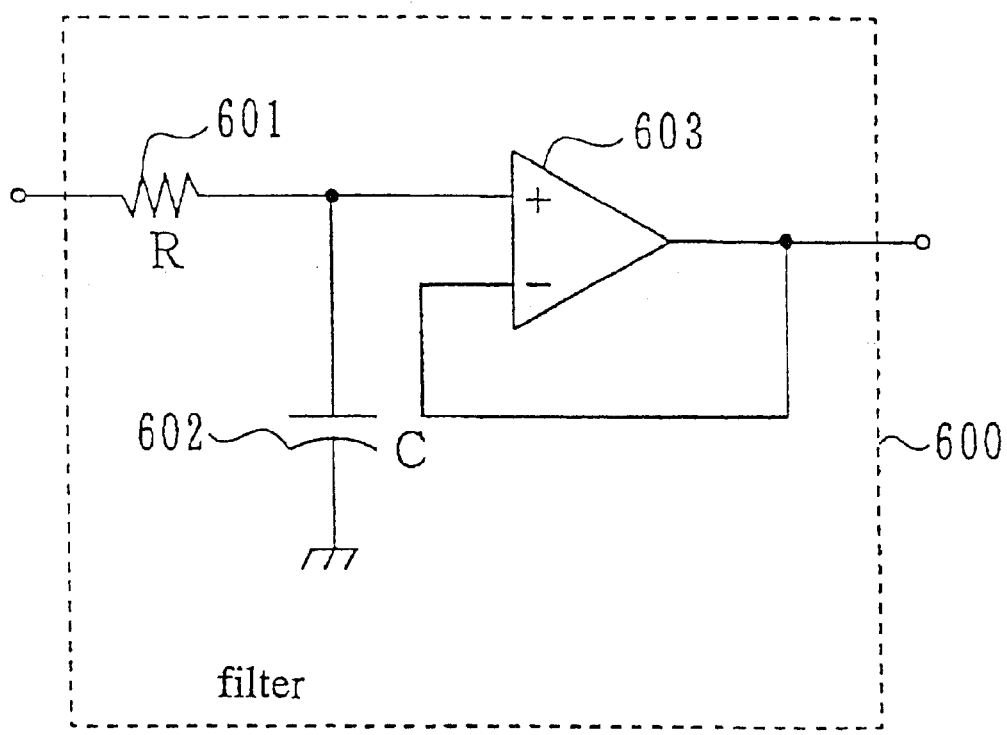
FIG. 6 is a circuit diagram illustrative of a filter in FIG. 1.

FIG. 6 is shows an example of the circuit of the filters 217, 223, and 229.

As shown in the same drawing, in this example, the low pass filter is structured which comprises the resistance 601 and the capacitor 602. The cut off frequency of the low pass filter is represented by 1/(2 πCR), provided that R is the resistance value of the low pass filter, and C is the capacity of the capacitor 602. The operational amplifier 603 is a buffer for reducing the output impedance of the filter, thereby forming a voltage-follower.

With reference to the drawing, the integration circuit and the bias circuit in accordance with the present invention are compared to the conventional integration circuit and the bias circuit.

Figure 7:
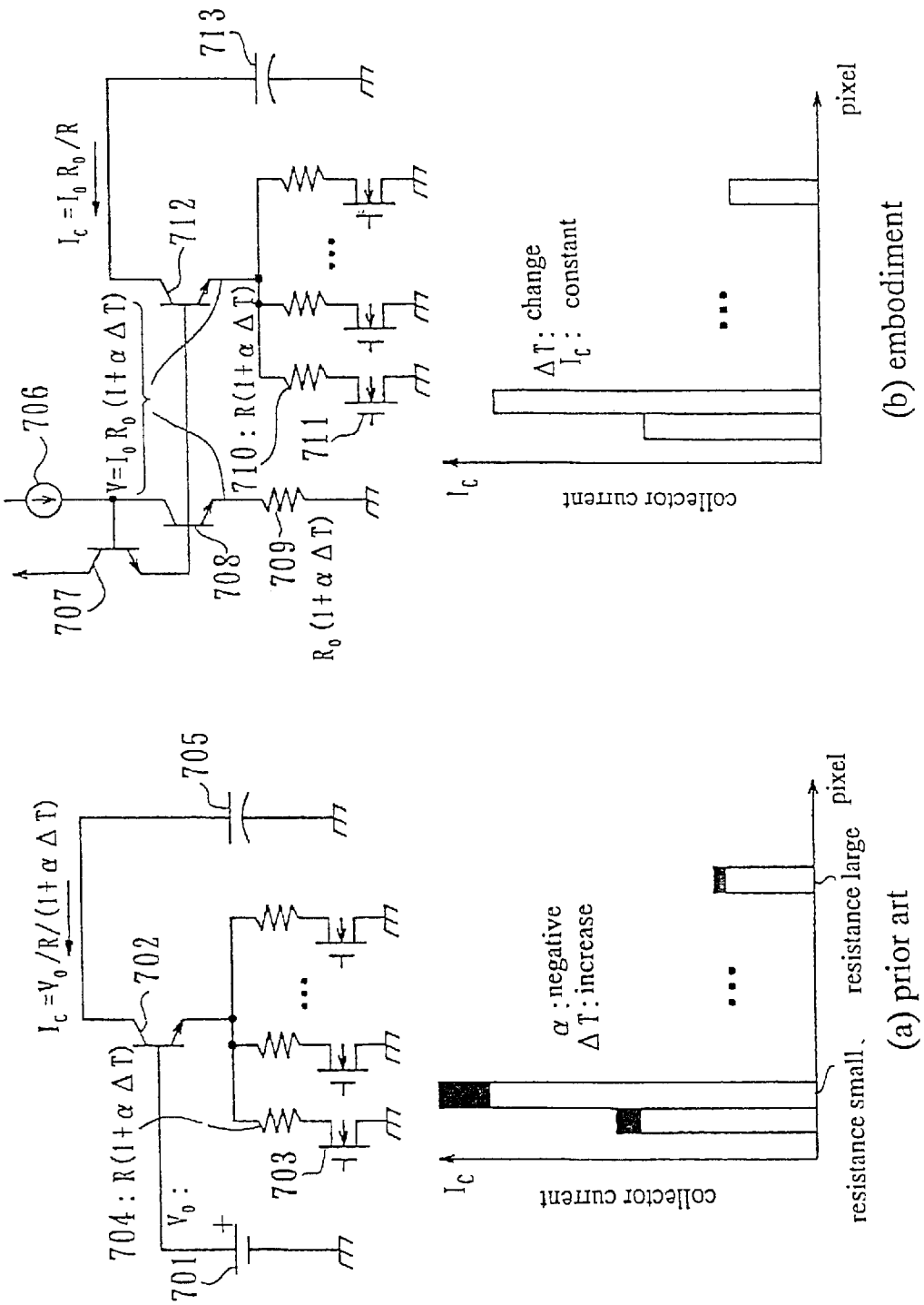
FIG. 7($a$) is a circuit diagram illustrative of a conventional integration circuit and a conventional bias circuit and of a collector current in each pixel, and ($b$) is a circuit diagram illustrative of an integration circuit a bias circuit in accordance with this present embodiment and of a collector current in each pixel.

FIG. 7(a) is a circuit diagram of the conventional integration circuit and the bias circuit and a graph showing the collector current in each pixel. Similarly, FIG. 7(b), is a circuit diagram of the integration circuit and the bias circuit in accordance with the pre sent invention and shows a graph of the collector current in each pixel.

A s shown in FIG. 7(a), the conventional integration circuit and the bias circuit are provided with a power source 701 outputting a constant voltage V0, an integration transistor 702 with base connected to the power 701, a plurality of bolometer 704 connected to the emitter of the integration transistor 702, pixel switches 703 connected to the individual bolometers 704 and an integration capacitor 705 connected to the collector of the integration transistor 702.

In the prior art as shown in FIG. 7(a), a constant bias is applied to the base of the integration transistor 702. The collector current (namely integration current) is given by:

$$Ic=V0/R/(1+\alpha \Delta T) \qquad (7).$$

R is the resistance value of the bolometer 703 at a temperature of 25° C., and α is the TCR and ΔT is the temperature increase of the silicon substrate.

As can be seen from this equation, variation in ΔT increases variation in Ic in the pixel with the small bolometer resistance and the large bias current.

In the pixel with the large bolometer resistance, variation in Ic is small. Namely, variation in the amount of varying the collector current Ic is the fixed pattern noise if the device temperature is changed.

By contrast, in accordance with the present invention shown in FIG. 7(b), the circuit is provided with a constant current circuit 706, an NPN transistor 707 with a base connected to the constant current circuit 706, an NPN transistor 708 with a collector connected to the constant current circuit 706 and a base connected to the emitter of the NPN transistor 707, a reference resistance 709 connected between the emitter of the NPN transistor 708 and the ground, an NPN transistor 712 with a base connected to the base of the NPN transistor 708, a plurality of bolometers 710 connected to the emitters of the NPN transistors 712, a plurality of pixel switches 711 connected to the bolometers 710 and an integration capacitor connected between the NPN transistor 712 and the ground.

In accordance with the present invention shown in FIG. 7(b), the voltage of the reference resistance 709 is applied to the each bolometer 710. Since TCR of the reference resistance 709 is the same as the TCR of the bolometer 710, the collector current is almost independent from ΔT, thereby suppressing the fixed pattern noise (FPN).

In the two-dimensional thermal infrared ray image pick-up device with 320×240 pixels and a pixel pitch 50 μm, variation in the bolometer resistance in plane is about 10%p-p whereby the bias current varies about 10%p-p. In the prior art shown in FIG. 7(a), variation in the device temperature of x° C. causes variation in bias current at about x° C.×2%/° C.×I0. Depending upon the variation of the bias current, the variation amount is about x° C.×2%/° C.×10%p-p×I0. Namely, the fixed pattern noise is generated.

On the other hand, in order to obtain a noise equivalent temperature difference (NETD) corresponding to the temperature resolving power of the infrared ray image pick-up device, a temperature change of 0.1° C. of the sample causes a temperature of the diaphragm to vary by 0.1 m° C. If TCR of the bolometer is 2%/° C., whereby the bias current I0 is varied at about 2E−6×I0 which corresponds to the bias modulation degree in view of the minimum resolving power temperature difference. It is necessary that the above fixed pattern noise is not more than this. Namely, it is necessary to suppress the device temperature variation "x" within 1 m° C. The temperature stabilizer such as Peltier device usually used is difficult to realize the above condition as having only an accuracy of 10 m° C.

By contrast, in the present embodiment, the bias current almost remain unchanged by the variation of the device temperature. Such the problem is not raised. If there is a variation in TCR of the bolometer, the fixed pattern noise is generated even in accordance with the present invention. Normally, the variation in TCR is 0.1%. In this case, it is preferable to conduct the temperature control in accuracy of not more than 100 m° C.

Figure 8:
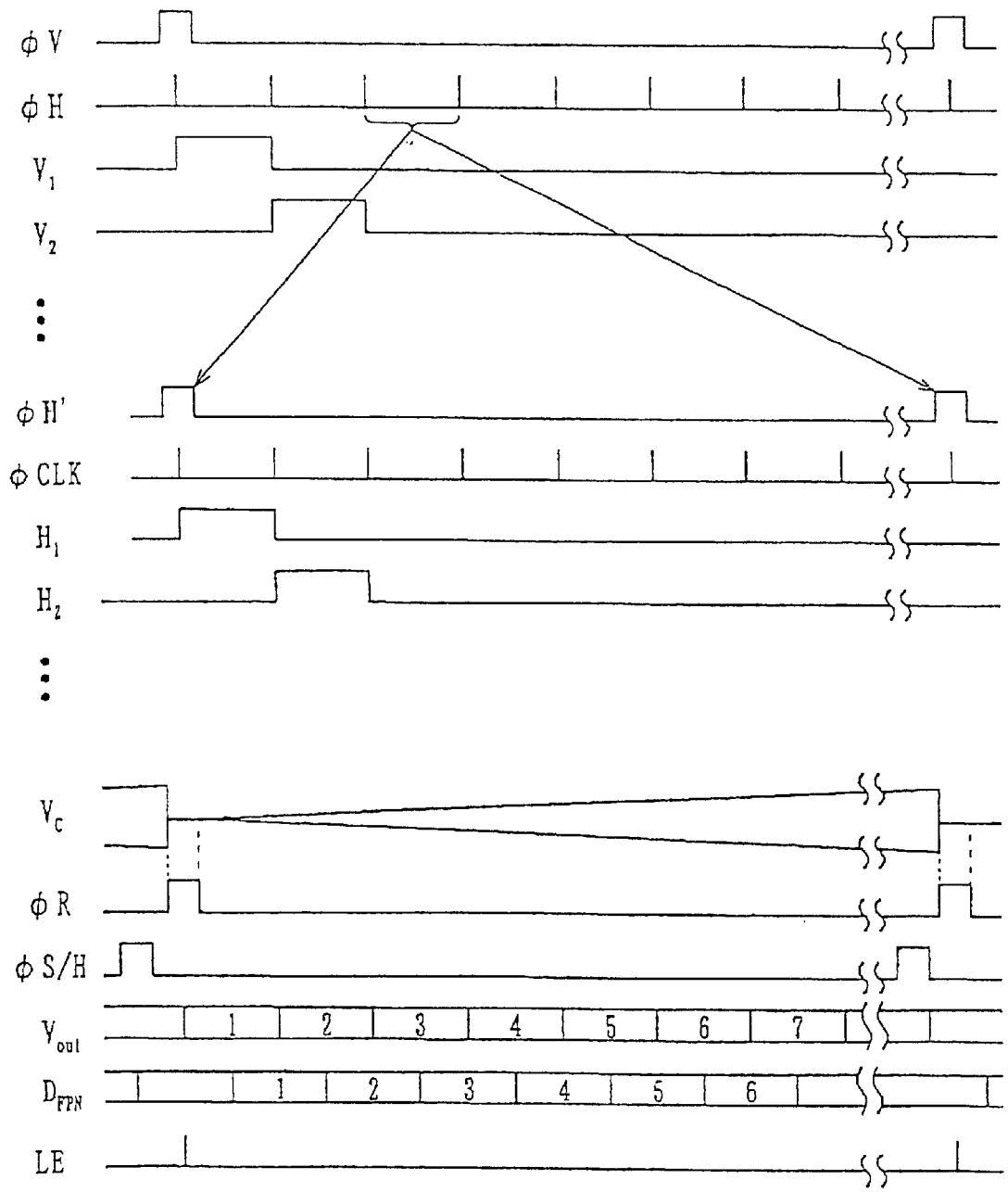
FIG. 8 is a timing chart showing operation in the present embodiment.

FIG. 8 is a timing chart of operation of the circuit in FIG. 2. As shown in the drawing, ΦV is the vertical synchronizing signal of about 30 Hz and is inputted into the data terminal of the vertical shift resister 233.

ΦH is the horizontal synchronizing signal of about 7 KHz and is inputted into the clock terminal of the vertical shift resister 233, whereby vertical selecting signals V1, V2, - - - are outputted from the vertical shift resister 233 to conduct a readout operation as integration in the readout circuits 201 in each column during one row is selected.

Vc is the voltage wave (integration waveform) of the integration capacitor 205 in FIG. 2. The sample hold circuit 230 is applied with the sample hold pulse ΦS/H, for sampling the integrated voltage which will be stored in the hold capacitor in the sample hold circuit 230. After the sampling, the reset pulse ΦR is applied to the reset switch 206 to reset the integration capacitor 205.

The horizontal synchronizing signal ΦH' is inputted into the data terminal of the horizontal shift resister 232. The clock signal ΦCLK is inputted into the clock terminal, to obtain the horizontal selecting signals H1, H2, - - - . The horizontal selecting signals HI, H2, - - - sequentially select the multiplexers 231 in FIG. 2. Signals stored in the hold capacitors on each column are outputted through the multiplexers 231 as output signals Vout. As the horizontal synchronizing signal ΦH', the same signal as the horizontal synchronizing signal ΦH or other signals may be available.

The horizontal selecting signals H1, H2, - - - are inputted into the control terminals (terminals for controlling the writing) of he FPN data buffer 234 in FIG. 2. A latch enable LE is inputted into the FPN data buffer 235. FPN data (DFPN) are transferred to the FPN data buffer 235 before the reading out operation to one column, so that at a timing of switching the row, they are transferred to the FPN date buffer 235 and stored therein. The FPN buffer 235 is connected to the NMOS transistor 210 to decide the constant current value outputted from the FPN correction circuit 236.

Other embodiments (second to fifth embodiment) of the present invention will be described with reference to the drawings.

Figure 9:
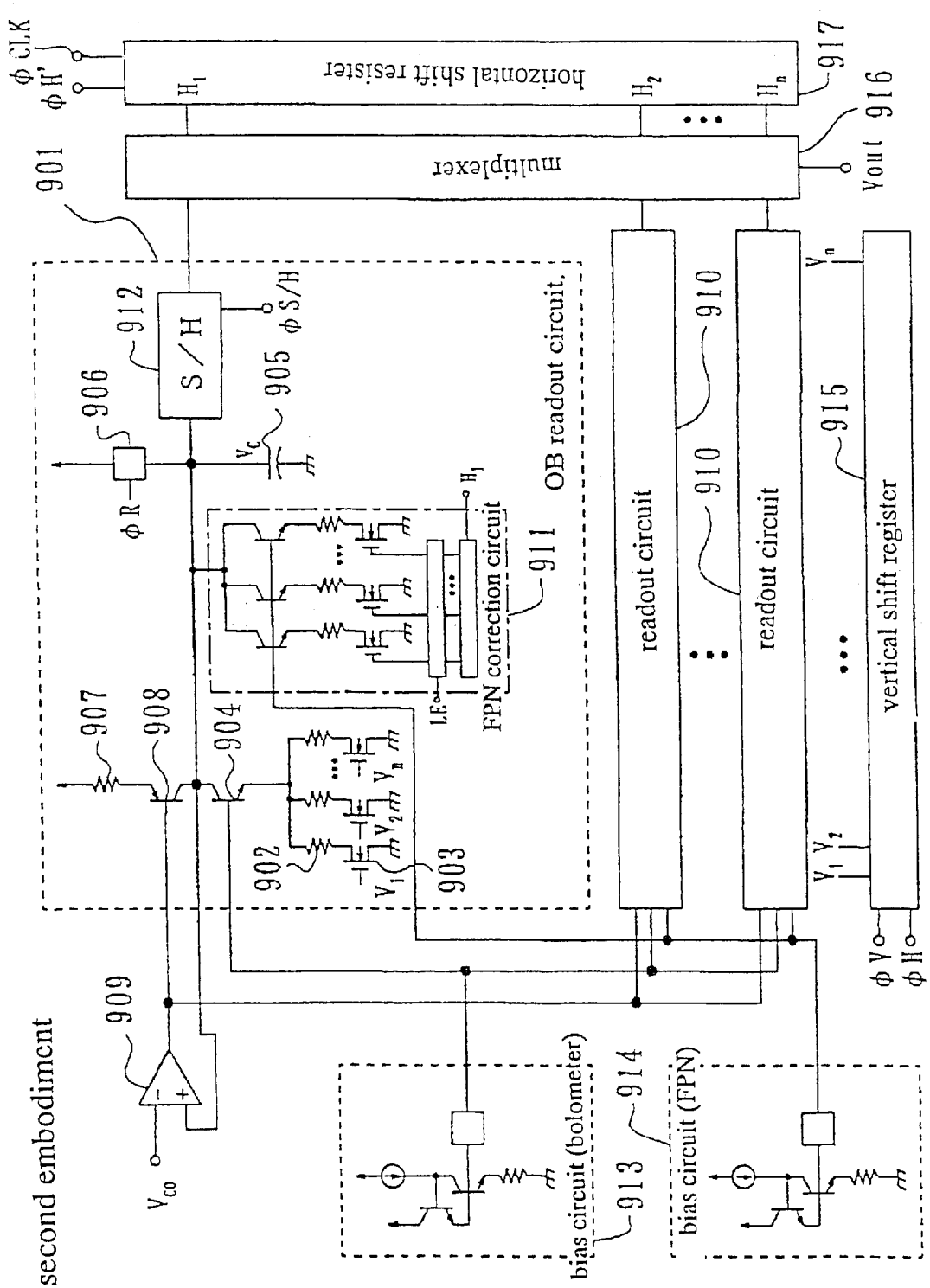
FIG. 9 is a circuit diagram illustrative of a second embodiment in accordance with the present invention.

FIG. 9 is a circuit of the thermal infrared ray image pick-up device in the second embodiment in accordance with the present invention.

As shown in the drawing, in this embodiment, the circuit is provided with a single OB readout circuit 901, a plurality of readout circuits 910 similarly to in FIG. 2, an operational amplifier 909, a bias circuit 913 for bolometer, a bias circuit 914 for the FPN collection circuit, a multiplexer 916, a horizontal shift resister 917, and a vertical shift resister 915.

In this embodiment, the OB readout circuit 901 is provided. In place of the bias circuit 218 in FIG. 2, the operational amplifier 909 is provided. The operational amplifier 909 and the input terminal are connected to the integration capacitor 905 in the readout circuit 901 and its one input terminal is applied with a bias voltage Vc0. The output terminal of the operational amplifier 909 is connected to the base of the NPN transistor 908 in the readout circuit 901.

The OB readout circuit 901 is provided with an NPN transistor 904, a PNP transistor 908, a plurality of bolometer 902, pixel switches 903 connected between the individual bolometers 902 and the ground, an FPN correction circuit 911, a reset switch 906, an integration capacitor 905, and a sample hold circuit 912.

The OB readout circuit 901 is a special readout circuit differently from what is mentioned in FIG. 2. As the bolometer accommodated, a bolometer (OB bolometer 902) free of any sensitivity to the incident infrared ray is used.

This is so called as optical black bolometer (hereinafter referred to as OB bolometer) which is prepared by optically shielding the incident infrared ray.

Only the readout circuit 901 has the OB bolometer 902, and other read out circuit 910 is the normal readout circuit and thus the normal bolometer is used. The readout circuit 910 has a sensitivity to the infrared ray.

In this embodiment, setting the bias of the PNP transistor 908 is carried out to keep the voltage of the integration capacitor 905 in the readout circuit 901 at a constant voltage Vc0. Even if the variation of the device temperature causes the variation in the resistance value of the OB bolometer 902 whereby the variation in the bolometer current is varied, the current of the PNP transistor 908 is varied to follow this variation. The bias voltage to the base of the PNP transistor 908 is applied to the PNP transistor in the normal readout circuit 910, whereby the integration current of the read out circuit is temperature-compensated.

In this embodiment, it is possible to compensate the influence of the self-heat generation of the bolometer. Normally, if a current is applied to the thermally isolated bolometer, then the bolometer shows a self-heat generation by the Joule heat, whereby the temperature of the bolometer is increased. The self-heat generation by the bolometer makes the integration waveform Vc in FIG. 8 have distortion which occupies the dynamic range of the signal. In the circuit of FIG. 9, the OB bolometer 902 shows a self-heat generation similarly to the normal bolometer.

In order to make constant the voltage of the integration capacitor 905 of the OB readout circuit 901, a bias is applied to the PNP transistor 908, so that the variation in current flowing through the PNP transistor 908 follows variation in bolometer current by the self-heat generation.

Accordingly, the voltage of the integration capacitor 905 in the OB readout circuit 901 is kept in constant. It is possible to omit the integration capacitor 905 in the OB readout circuit 901.

Figure 10:
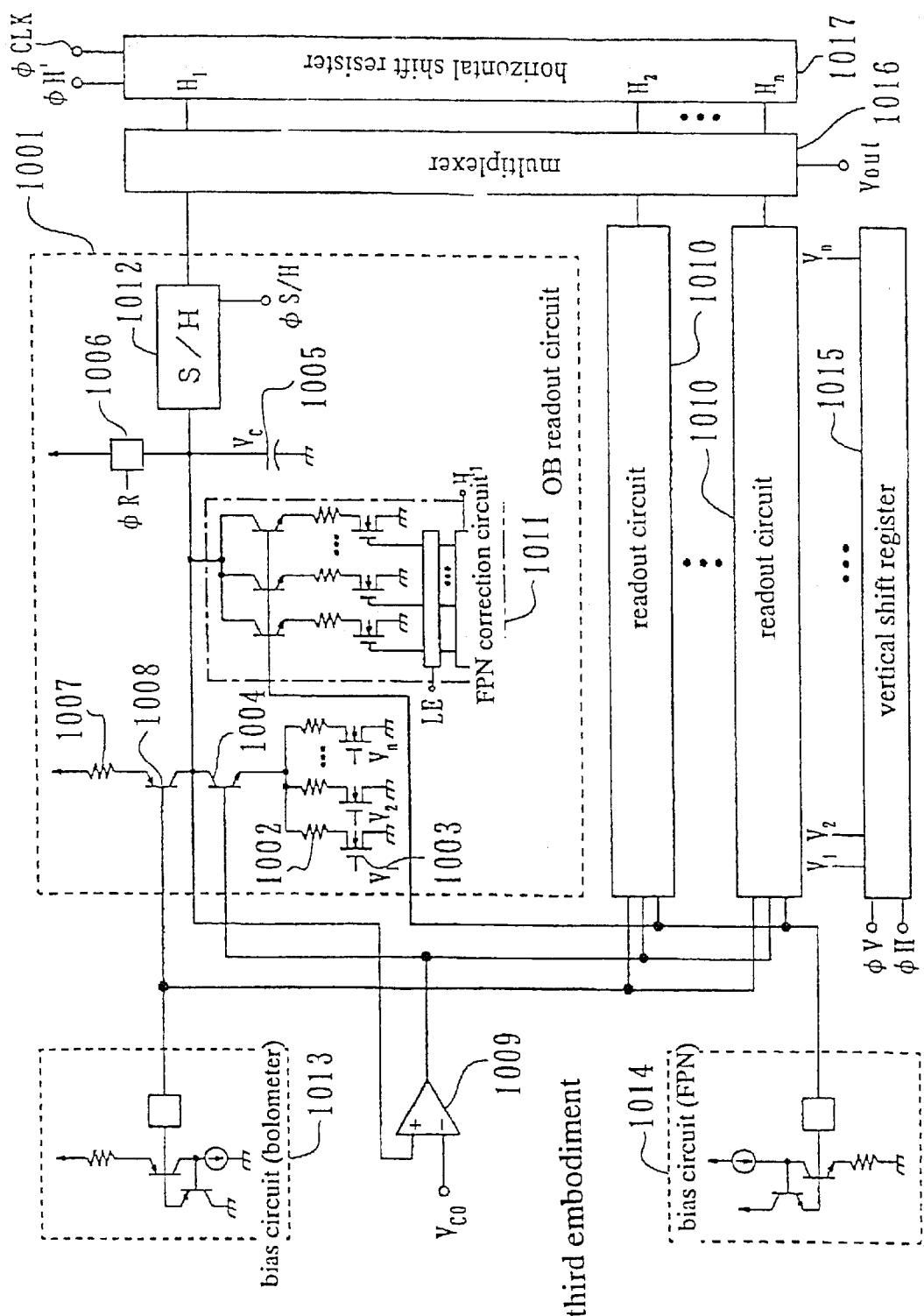
FIG. 10 is a circuit diagram illustrative of a third embodiment in accordance with the present invention.

FIG. 10 is a circuit of the thermal infrared ray image pick-up device in the third embodiment in accordance with the present invention.

As shown in the drawing, in this embodiment, the circuit is provided with a single OB readout circuit 1001, a plurality of readout circuits 1010 similarly to in FIG. 2, an operational amplifier 1009, a bias circuit 1013 for cancel resistance, a bias circuit 1014 for the FPN collection circuit, a multiplexer 1016, a horizontal shift resister 1017, and a vertical shift resister 1015.

In this embodiment, in place of the bias circuit 212 in FIG. 2, the operational amplifier 1009 is provided. It's +input terminal is connected to the integration capacitor 1005 in the readout circuit 1001 and its −input terminal is applied with a bias voltage Vc0. The output of the operational amplifier 1009 is connected to the base of the NPN transistor 1004.

The bolometer 1002 in the readout circuit 1001 comprises the OB bolometer. The normal readout circuit 1019 other than the OB readout circuit 1001 having the OB bolometer have the same structure as shown in FIG. 2 and are sensitive to infrared ray.

As described in the second embodiment, in this embodiment, the bias of the NPN transistor 1004 is set so that the voltage of the integration capacitor 1005 in the OB readout circuit 1001 is kept at a constant voltage Vc0, whereby it is possible to cancel influences of the device temperature variation and the self-heat generation of the bolometer.

Figure 11:
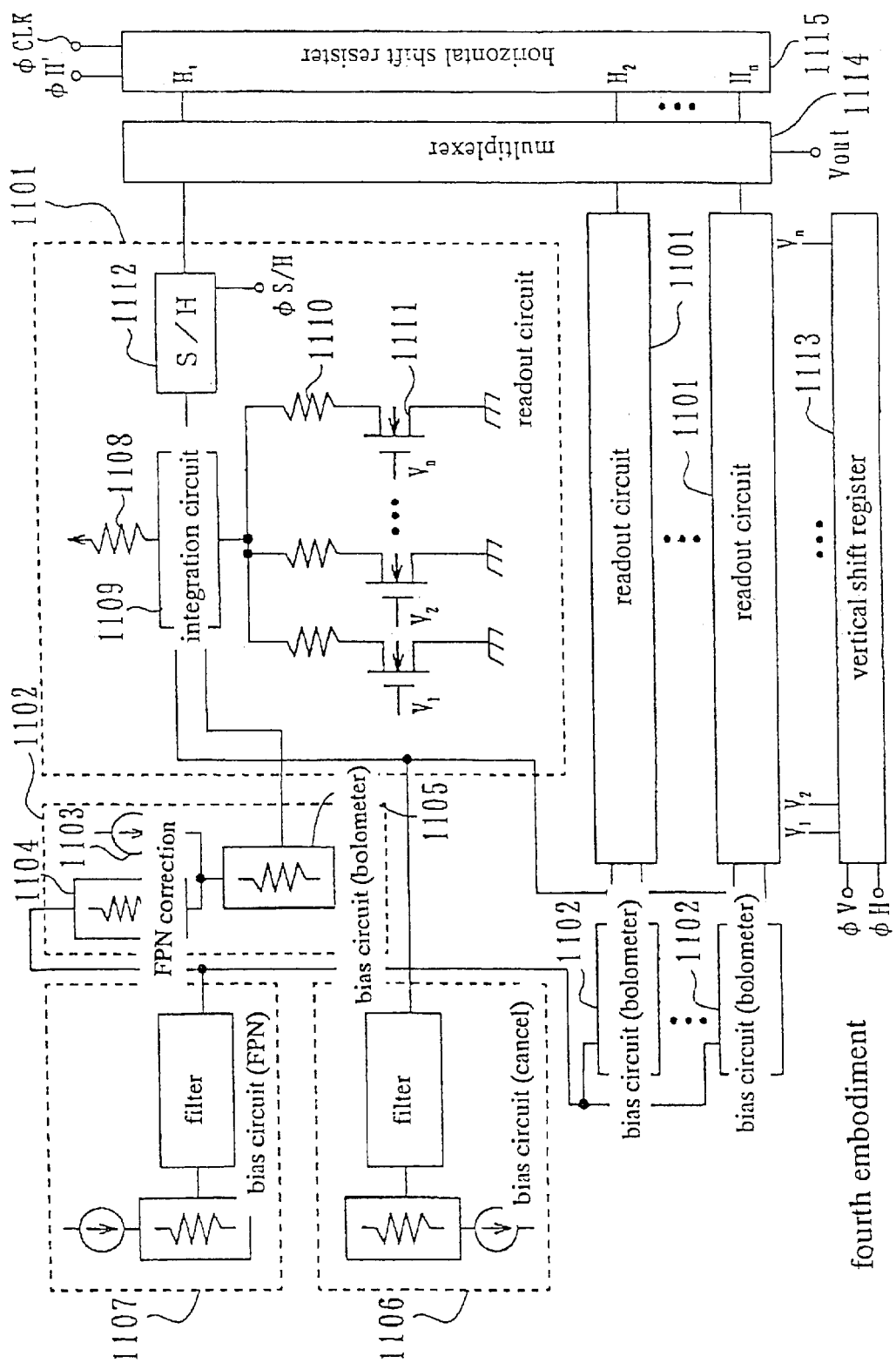
FIG. 11 is a block diagram illustrative of a fourth embodiment in accordance with the present invention.

FIG. 11 is a circuit of the thermal infrared ray image pick-up device in the fourth embodiment in accordance with the present invention.

As shown in the drawing, in this embodiment, the circuit is provided with a readout circuit 1101, a bias circuit 1106 for the cancel resistance, a bias circuit 1106 for cancel resistance, a bias circuit 1107 for the FPN collection circuit, a vertical shift resister 1113, a multiplexer 1114, and a horizontal shift resister 1115.

In this embodiment, each of the readout circuit 1101 is provided with the bias circuit 1102 for the bolometer, and this bias circuit 1102 has a constant current source 1103, an FPN correction circuit 1104 and a reference resistance circuit 1105. In place of making the bias circuit 1102 have the FPN collection circuit 1104, each of the readout circuits 1101 does not have the FPN collection circuit.

The bias circuit 1107 provides a bias to the FPN collection circuit 1104 in the bias circuit 1102. Other configurations are the same as in FIG. 1. Namely, the readout circuit 1101 is provided with the cancel resistance 1108, the integration circuit 1109, the bolometer 1110 and pixel switch 111 comprising the NMOS transistor, and a sample hold circuit 1112.

The bias circuit 1102 is provided with the FPN collection circuit 1104 to compensate variation in sensitivity for every pixels. The FPN collection circuit in FIG. 1 operate to supplement an additional current to variation of the bolometer. By contrast, the FPN collection circuit 1104 in FIG. 11 operates to prevent variation in the bolometer current.

Consequently, the sensitivity to the incident infrared ray is proportional to the bolometer current, whereby the variation of the bolometer current is reduced to reduce the variation in sensitivity of the each pixel.

The detail structure of FIG. 11 will be described.

Figure 12:
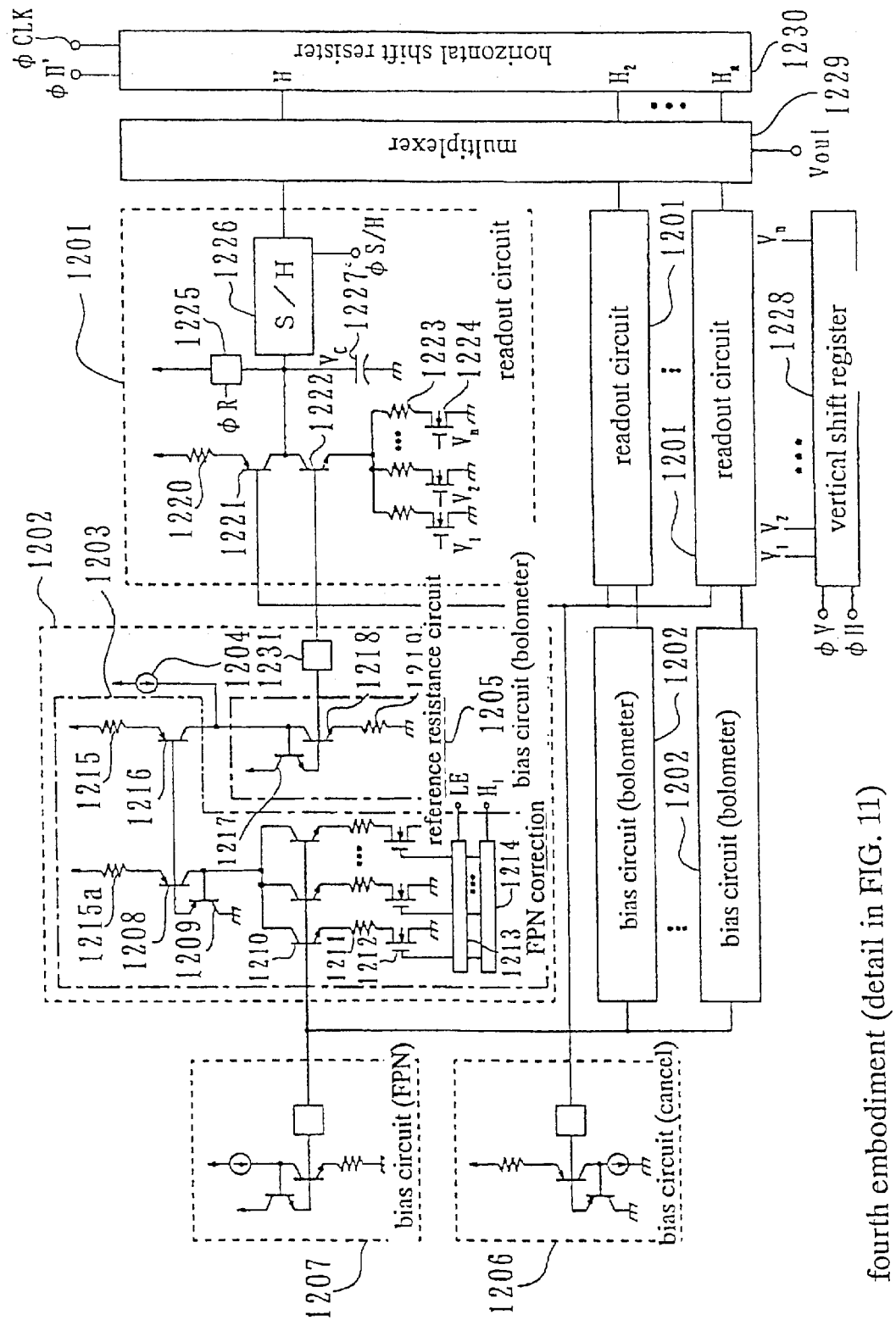
FIG. 12 is a circuit diagram showing details of FIG. 11.

FIG. 12 is a concrete circuit diagram of the fourth embodiment in accordance with FIG. 11.

As shown in the drawing, the circuit of this embodiment is provided with a plurality of readout circuit 1201, a bias circuit 1202 provided in each of the readout circuit 1201, a bias circuit 1207 for the FPN collection circuit, a bias circuit 1206 for the cancel resistance, a vertical shift resister, a multiplexer 1229 and a horizontal shift resister 1230.

Each of the readout circuit 1201 is provided with a resistance 1220, a PNP transistor 1221, an NPN transistor 1222, a bolometer 1223, a pixel switch 1224. A reset switch 1225, an integration capacitor 1227 and a sample hold circuit 1226.

Each of the bias circuits 1202 is provided with an FPN correction circuit 1203, a temperature-compensated circuit 1204, and a reference resistance circuit 1205.

The FPN correction circuit 1203 is provided with a resistance 1215a, PNP transistors 1208 and 1209, an NPN transistor 1210, a resistance 1211, an NMOS transistor 1212, data buffers 1213 and 1214, a resistance 1215 and a PNP transistor 1216.

The base of the NPN transistor 1210 in each of the FPN correction circuit 1203 is connected to an output of the bias circuit 1207.

The reference resistance circuit 1205 has a resistance 1219 with the same TCR as the bolometer 1223 and NPN transistors 1217 and 1218. The base of the NPN transistor of the reference resistance circuit 1205 is connected to the collector of the NPN transistor 1218. The resistance 1219 is "a" times of the resistance value of the bolometer 1223. An emitter area of the NPN transistor 1222 is 1/a times of the emitter area of the NPN transistor 1222.

The temperature-compensated constant current circuit 1204 outputs a current 10 with a small temperature dependency similarly to the example in FIG. 2.

Similarly to the NPN transistor 211 in FIG. 2, the FPN correction resistance 209, and the NMOS transistor 210, the constant current set in digital in accordance with the variation in resistance value of the bolometer is outputted. This constant current has a small temperature dependency by the bias circuit 1207. The FPN correction circuit 1203 is structured to obtain the source current similarly to the structure of FIG. 3(c).

The currents outputted from the temperature-compensated constant current circuit 1204 and the FPN correction circuit 1203 are in sum applied to the reference resistance circuit 1205, and a bias voltage outputted from the reference resistance circuit 1205 is applied to the base of the NPN transistor 1222, so that the bolometer current is almost free of temperature dependency and reduces variation in current and reduces the variation in sensitivity.

As described above, in the two-dimensional thermal infrared ray image pick-up device with 320×240 pixels and a pixel pitch. In the conventional circuit, the variation in sensitivity of about 10%p-p is generated as the resistance variation. By contrast, in accordance with the present invention, even if the there is a variation in resistance of the bolometer, the correction is made so that the bias current becomes almost the same to considerably reduce the variation in sensitivity. The remaining variation in sensitivity is due to the variation in plane of TCR, and 0.1%p-p in the above thermal infrared ray image pick-up device.

Figure 13:
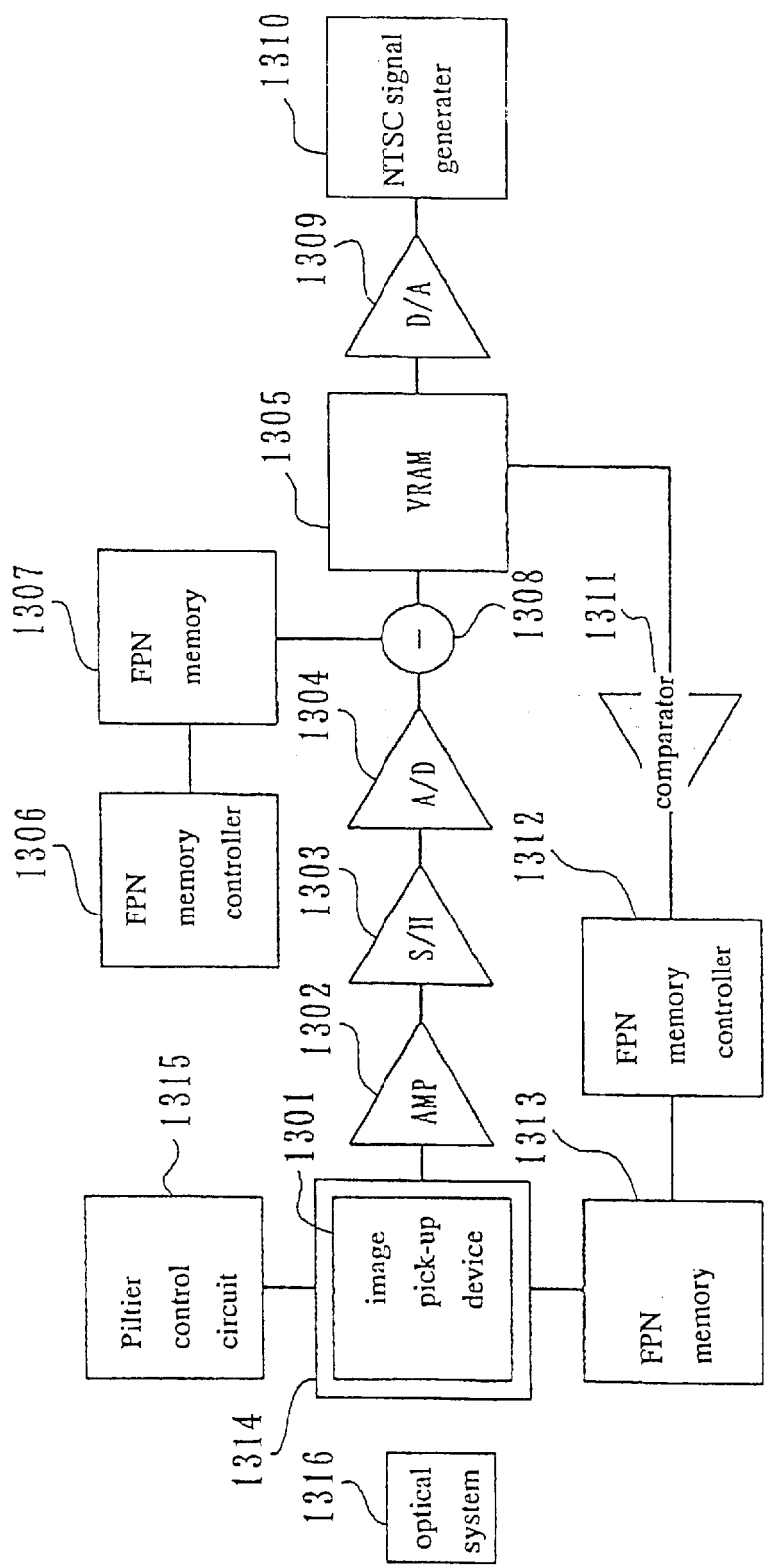
FIG. 13 is a block diagram illustrative of a fifth embodiment in accordance with the present invention.

FIG. 13 is a block diagram illustrative of entire of an image pick-up device in a fifth embodiment in accordance with the present invention.

As shown in the drawing, the image pick-up device in accordance with the embodiment is provided with a sample hold circuit 1303, an A/D converter 1304, a VRAM 1305, an FPN memory controller 1306, an FPN memory 2, an FPN memory 1307, a digital subtracter 1308, a D/A converter 1309, an NTSC (National Television System Committee) signal generator 1310, a comparator 1311, an FPN memory controller 1312, an FPN memory 1313, a temperature stabilizer 1314 comprising a Peltier device, a Peltier control circuit 1315 for controlling a driving of the temperature adjuster and an optical system 1316.

The image pick-up device 1301 is formed to have a structure as shown in FIG. 2 on a single silicon substrate. The optical system is provided in opposition to the image pick-up device 1301. The externally incident light is condensed onto the image pick-up device 1301. The image pick-up device 1301 converts the light into electric signals which are then amplified by an integration circuit in the image pick-up device 1301 and then outputted to outside.

The amplifier 1302 amplifies the output signal from the image pick-up device 1301 to input the same into the sample hold circuit 1303. The sample hold circuit 1303 temporary holds the received signal.

The amplifier 1302 may not be used if the output signal from the image pick-up device 1301 is sufficiently large.

The A/D converter 1304 converts the signal held in the sample hold circuit 1303 into digital signals. In case of the infrared ray image pick-up device, the bit number of the A/D converter 1304 is as follows.

For example, if the temperature resolving power of the sample is 0.1° C. and the temperature dynamic range of the sample is 100° C., the 10-bits (about 1000 gray scales) as the bit number is necessary. In order to further reduce the quantization error, 2-bits (four gray scales) is allocated to each of the minimum temperature resolving power. A data width of 12-bits in total is necessary for the A/D converter 1304.

The VRAM 1305 is a memory for holding digital signals of 12 bits in each pixel. If, for example, the image pick-up device 1301 has 320×240 pixels, then a capacity of about 320×240×12-bits is sufficient.

In order to manage data in byte-unit, it is optionally prepare a larger capacity, for example, 320×240×16-bits.

The FPN memory 1307 is means for correcting residual variation which could not be removed by he FPN correction carried out in the image pick-up device 1301 and holds data of variations for each pixel for the correction.

The FPN memory controller 1306 is a circuit for controlling the FPN memory 1307. The digital subtracter 1308 is to subtract the variation amount for each pixel from the each pixel signal coming in real time. Obtaining the data for variation is preferably carried out in the following sequences after the FPN correction data are obtained in the image pick-up device 1301.

In a state where the incident light is cut-off by a shutter, each pixel data outputted from the A/D converter 1304 have variations which could not removed in the FPN correction process in the image pick-up device 1301. These data are stored in the FPN memory 1307.

This operation is carried out in power-on operation and the previous correction is different. In the normal image pick-up state, the stored data of variation of the FPN memory 1307 are transferred to the subtracter 1308 so as to subtract the same from the signals for each pixel coming in real-time thereby obtaining variation-free signals.

Of course, in place of the subtracter 1308, the adder is also usable. Namely, a complement of the data of the FPN memory 1307 is taken for using the adder so that the same operation as the subtracter is available.

The subtracter 1308 is not necessarily positioned at a position shown in FIG. 13 and, for example, may be positioned between the VRAM 1305 and the D/A converter 1309.

Thereafter, the D/A converter 1309 converts the processed signal signals into analog signals to transmit the same to the NTSC signal generator 1310.

The NTSC signal generator 1310 outputs NTSC composite signals by synthesis of this analog signal and the predetermined synchronizing signal. In place of signal generators, the other types signal generators are available such as NTSC signal generator 1310 and the PAL (Phase Alternation by Line) or RGB output.

The correction data to be supplied to the FPN correction circuit in the image pick-up device 1301 is obtained as follows.

The comparator 1311 used in this embodiment is a digital comparator to judge whether the signal level of the each pixel is larger or smaller than the reference level.

This reference level may be set as an upper limit or a lower limit of the dynamic ranges for signal processing circuits such as the integration circuit or amplifier in the image pick-up device 1301, and A/D converter or set as a value of the sum of a predetermined level margin to the upper limit or the lower limit.

Judgment of larger or smaller relationship may optionally be any of that not less than the predetermined reference level is good, or not more than the predetermined reference level is good.

The FPN memory controller 1312 prepares the FPN correction data in accordance with this comparative result. The prepared FPN correction data are stored in the FPN memory 1313. Accordingly, it is sufficient that the FPN memory 1313 has a capacity of the product of the total number of pixels and the bit number of the FPN correction data. In case of 320×240 pixels and the 6-bits FPN correction data, the capacity of 320×240×6-bits is sufficient. In order to control the data in byte-unit, it is possible to increase the capacity if nay.

In the above five embodiments, the readout circuit is provided with a plurality of bolometers. The present invention should not be limited to this. For example, if the image pick-up device is applied to a human body detector or a fire detector, it is sufficient to detect any existence of an infrared ray, for which reason at least one bolometer is necessary in the readout circuit. In case of the single pixel, no variation depending upon pixel is cased. No FPN correction circuit nor bias circuit for the FPN correction circuit are necessary.

Considering the above facts, the above cases are applied to the first to fifth embodiments.

For example, in the first and fourth embodiments, the single readout circuit having the single bolometer is provided, or two bolometers, one of which is OB bolometer, are provided in the single readout circuit. If the two bolometers are provided in the single readout circuit, then it is possible that the FPN correction circuit and the bias circuits for the FPN correction circuit may be provided.

In the second and third embodiments, the single readout circuit provided with the single bolometer is used in combination with the single reads out circuit provided with the single OB bolometer.

Further in the fifth embodiment, the image pick-up device has the single pixel.

As described above, in accordance with the present invention, there are further provided at least any one of the first bias circuit provided with a reference resistance being connected to the above measuring resistance group and having the same resistance temperature coefficient as the above measuring resistance, a second bias circuit provided with a reference resistance being connected to the above cancel resistance and having the same resistance temperature coefficient as the above cancel resistance, and the third bias circuit provided with a reference resistance being connected to the above correction resistance and having the same resistance temperature coefficient as the above correction resistance. The first bias circuit is means for applying the output voltage to the above measuring resistance group. The second bias circuit is means for applying the output voltage to the above cancel resistance. The third bias circuit is means for applying the output voltage to the above correction resistance. The following effects can be obtained.

As structured in the present invention, it is possible to suppress variation in sensitivity among pixels caused by the device temperature variation into about 1/100 of the prior art. The structure of connecting the resistance to the emitter of the bipolar transistor results in the low noise.

Application of the voltage to the measuring resistance such as the bolometer prevents the measuring resistance from showing a self-heat generation, whereby the dynamic range of the signal processing circuit including the integration circuit has a margin to increase the gain of the circuit. Particularly, increase in the gain of the integration circuit on the first stage reduces the input conversion noise whereby the S/N is largely improved.

It is possible to set the bias in digital with keeping the low drift and low noise. This structure is simple and a highly performance semiconductor device can be realized at a low cost.

Descriptions of Reference Numbers 101, 111, 114 - - - constant current circuit,
102, 112, 115 - - - reference resistance circuit,
103, 113, 116 - - - filter,
104 - - - bolometer,
105 - - - integration circuit,
106 - - - cancel resistance,
107 - - - pixel switch,
108 - - - FPN correction circuit,
109 - - - sample hold circuit,
111 - - - multiplexer,
117 - - - readout circuit,
118 - - - horizontal shift resister,
119 - - - vertical shift resister,
120, 121, 122 - - - bias circuit,
ΦV - - - vertical synchronizing signal,
ΦH - - - horizontal synchronizing signal,
ΦH' - - - horizontal synchronizing signal,
ΦCLK - - - clock signal,
ΦS/H - - - sample hold pulse,
Vout - - - output voltage,
V1, V2, - - -, Vn - - - vertical selecting signal,
H1, H2, - - -, Hn - - - horizontal selecting signal.

What is claimed is:

1. A semiconductor device provided with a read-out circuit, comprising:
    a measuring resistance group with at least one measuring resistance for converting a physical value to a resistance value;
    a switching means connected to each said measuring resistance for allowing a desired measuring resistance to be conductive;
    an integration circuit connected to said measuring resistance group for applying a bias current to said measuring resistance group and integrally accumulating a current which flows through said measuring resistance group;
    a cancel resistance electrically connected to said measuring resistance group for canceling said bias current which flows through said measuring resistance group; and
    a correction resistance group comprising a plurality of correction resistance electrically connected to said measuring resistance group for correcting variations in resistance value of each said measuring resistance, so that variation in resistance value of said measuring resistance group is detected on a basis of a current accumulated in said integration circuit,
    a first bias circuit being electrically connected to said measuring resistance group and being provided with a reference resistance equal in resistance temperature coefficient to said measuring resistance;
    a second bias circuit being electrically connected to said cancel resistance group and being provided with another reference resistance equal in resistance temperature coefficient to said cancel resistance; and
    a third bias circuit being electrically connected to said correction resistance group and being provided with still another reference resistance equal in resistance temperature coefficient to said correction resistance;
    wherein said first bias circuit comprises means for applying its output voltage to said measuring resistance group,
    said second bias circuit comprises means for applying its output voltage to said cancel resistance, and
    said third bias circuit comprises means for applying its output voltage to said correction resistance.

2. The semiconductor device as claimed in claim 1, wherein,
    said integration circuit comprises first and second bipolar transistors with collectors connected with each other and an integration capacitor connected to said collectors,
    said first bipolar transistor has an emitter connected to said cancel resistance and a base connected to said second bias circuit, and
    said second bipolar transistor has an emitter connected to said measuring resistance group and a base connected to said first bias circuit.

3. The semiconductor device as claimed in claim 1, wherein,
    said first bias circuit is provided with a temperature-compensated constant current circuit, a reference resistance being connected to said constant current circuit and being equal in resistance temperature coefficient to said measuring resistance, and
    further comprising a filter being connected to said reference resistance for removing noises from a voltage generated from said reference resistance.

4. The semiconductor device as claimed in claim 1, wherein,
    said second bias circuit is provided with a temperature-compensated constant current circuit,
    a reference resistance is connected to said constant current circuit and is equal in resistance temperature coefficient to said cancel resistance, and
    a filter is connected to said reference resistance for removing noises from a voltage generated from said reference resistance.

5. The semiconductor device as claimed in claim 1, wherein,
    said third bias circuit is provided with a temperature-compensated constant current circuit,
    a reference resistance is connected to said constant current circuit and is equal in resistance temperature coefficient to said correction resistance, and
    a filter is connected to said reference resistance for removing noises from a voltage generated from said reference resistance.

6. The semiconductor device as claimed in claim 3, wherein,
    said constant current circuit is provided with a plurality of resistances connected in parallel to each other,
    a plurality of switching means are connected to each of said resistances, and
    a shift resistor is connected to said switching means.

7. The semiconductor device as claimed in claim 6, wherein,
    each of said plural resistances comprises a diffusion resistance.

8. The semiconductor device as claimed in claim 1, wherein,
    a plurality of said read-out circuits are provided, and
    one of said read-out circuits is a read-out circuit having no sensitivity to said physical value and a bias is applied to said measuring resistance group and said cancel resistance of other read-out circuits, so that an output from said read-out circuit free of sensitivity is constant.

9. The semiconductor device as claimed in claim 1, wherein,
    a plurality of said read-out circuits free of said correction resistance group are provided, and each of said read-out circuits is provided with said first bias circuit provided with said correction resistance group.

10. The semiconductor device as claimed in claim 1, wherein,
only a single measuring resistance is provided for actually detecting a physical value, whilst said correction resistance group and said third bias circuit are not provided.

11. The semiconductor device as claimed in claim 1, wherein,
said semiconductor device is any one of an infrared ray sensor, a microwave/milliwave detector, a temperature sensor, a magnetic sensor, a pressure sensor, a gas sensor and a flow sensor.

* * * * *